(12) United States Patent
Watanabe et al.

(10) Patent No.: US 8,546,847 B2
(45) Date of Patent: Oct. 1, 2013

(54) SEMICONDUCTOR DEVICE AND POWER CONVERSION APPARATUS USING THE SAME

(75) Inventors: So Watanabe, Mito (JP); Mutsuhiro Mori, Mito (JP); Taiga Arai, Mito (JP)

(73) Assignee: Hitachi, Ltd., Tokyo (JP)

( * ) Notice: Subject to any disclaimer, the term of this patent is extended or adjusted under 35 U.S.C. 154(b) by 278 days.

(21) Appl. No.: 12/958,894

(22) Filed: Dec. 2, 2010

(65) Prior Publication Data

US 2011/0133718 A1 Jun. 9, 2011

(30) Foreign Application Priority Data

Dec. 3, 2009 (JP) ................................ 2009-275047

(51) Int. Cl.
*H01L 21/00* (2006.01)
(52) U.S. Cl.
USPC ............................ 257/139; 257/133; 323/311
(58) Field of Classification Search
USPC .................................. 257/133, 139; 323/311
See application file for complete search history.

(56) References Cited

U.S. PATENT DOCUMENTS

| | | | |
|---|---|---|---|
| 5,329,142 A | 7/1994 | Kitagawa et al. | |
| 6,180,966 B1 * | 1/2001 | Kohno et al. | 257/173 |
| 6,570,240 B1 * | 5/2003 | Ohyanagi et al. | 257/575 |
| 6,657,257 B2 * | 12/2003 | Ohyanagi et al. | 257/347 |
| 7,170,106 B2 * | 1/2007 | Yamaguchi et al. | 257/133 |
| 7,230,283 B2 * | 6/2007 | Ohyanagi et al. | 257/133 |
| 7,335,928 B2 * | 2/2008 | Ohyanagi et al. | 257/133 |
| 7,378,741 B2 * | 5/2008 | Mauder | 257/762 |
| 7,638,839 B2 * | 12/2009 | Arai et al. | 257/331 |
| 7,875,951 B2 * | 1/2011 | Rieger et al. | 257/488 |
| 7,948,005 B2 * | 5/2011 | Mori et al. | 257/133 |
| 7,956,423 B2 * | 6/2011 | Arai et al. | 257/378 |
| 7,982,266 B2 * | 7/2011 | Watanabe et al. | 257/347 |
| 8,120,098 B2 * | 2/2012 | Arai et al. | 257/330 |
| 8,134,207 B2 * | 3/2012 | Watanabe | 257/343 |
| 8,159,039 B2 * | 4/2012 | Cheng | 257/506 |
| 8,212,313 B2 * | 7/2012 | Hanaoka | 257/330 |
| 8,344,480 B2 * | 1/2013 | Seok et al. | 257/565 |
| 2002/0195657 A1 * | 12/2002 | Williams et al. | 257/332 |

(Continued)

FOREIGN PATENT DOCUMENTS

| | | |
|---|---|---|
| EP | 1 793 423 A2 | 6/2007 |
| JP | 5-243561 A | 9/1993 |

(Continued)

OTHER PUBLICATIONS

European Search Report dated Mar. 2, 2012 (Twelve (12) pages).

(Continued)

*Primary Examiner* — Laura Menz
(74) *Attorney, Agent, or Firm* — Crowell & Moring LLP

(57) ABSTRACT

A semiconductor device provides a gate electrode formed on a lateral face of a wide trench, and thereby the gate electrode is covered by a gate insulating layer and a thick insulating layer to be an inter layer. Therefore, a parasitic capacitance of the gate becomes small, and there is no potential variation of the gate since there is no floating p-layer so that a controllability of the dv/dt can be improved. In addition, the conductive layer between the gate electrodes can relax the electric field applied to the corner of the gate electrode. In consequence, compatibility of low loss and low noise and high reliability can be achieved.

21 Claims, 29 Drawing Sheets

(56) References Cited

U.S. PATENT DOCUMENTS

| | | | |
|---|---|---|---|
| 2003/0049930 A1 | 3/2003 | Disney | |
| 2003/0160270 A1 | 8/2003 | Pfirsch et al. | |
| 2004/0041171 A1 | 3/2004 | Ogura et al. | |
| 2004/0094798 A1 | 5/2004 | Hara et al. | |
| 2004/0145012 A1* | 7/2004 | Shiga et al. | 257/330 |
| 2004/0169220 A1* | 9/2004 | Takemori et al. | 257/330 |
| 2004/0173845 A1* | 9/2004 | Aoki | 257/329 |
| 2004/0185622 A1* | 9/2004 | Williams et al. | 438/270 |
| 2005/0121795 A1* | 6/2005 | Mauder | 257/762 |
| 2005/0263852 A1 | 12/2005 | Ogura et al. | |
| 2008/0217649 A1* | 9/2008 | Arai et al. | 257/139 |
| 2008/0283867 A1* | 11/2008 | Mori et al. | 257/133 |
| 2008/0315301 A1* | 12/2008 | Takemori et al. | 257/331 |
| 2009/0114923 A1 | 5/2009 | Iwamuro | |
| 2009/0179298 A1* | 7/2009 | Cheng | 257/506 |
| 2010/0039844 A1* | 2/2010 | Arai et al. | 363/131 |
| 2010/0187603 A1* | 7/2010 | Hanaoka | 257/330 |
| 2010/0308399 A1* | 12/2010 | Saito et al. | 257/329 |
| 2011/0133718 A1* | 6/2011 | Watanabe et al. | 323/311 |
| 2012/0068258 A1* | 3/2012 | Ono et al. | 257/329 |
| 2012/0184072 A1* | 7/2012 | Cheng | 438/127 |
| 2012/0273897 A1* | 11/2012 | Shiraishi et al. | 257/379 |
| 2012/0292662 A1* | 11/2012 | Matsuura et al. | 257/139 |

FOREIGN PATENT DOCUMENTS

| | | | | |
|---|---|---|---|---|
| JP | 2000-307116 A | | 11/2000 | |
| JP | 3288218 B2 | | 3/2002 | |
| JP | 2004-39838 A | | 2/2004 | |
| JP | 2004-95954 A | | 3/2004 | |
| JP | 2004088001 A | * | 3/2004 | |
| JP | 2005-340626 A | | 12/2005 | |
| JP | 2006-222455 A | | 8/2006 | |
| JP | 2007-150121 A | | 6/2007 | |
| JP | 2007194660 A | * | 8/2007 | |
| JP | 2008-288386 A | | 11/2008 | |
| JP | 2009010395 A | * | 1/2009 | |
| JP | 4284428 B2 | | 4/2009 | |
| JP | 2009-194044 A | | 8/2009 | |
| JP | 2009-200103 A | | 9/2009 | |
| JP | 2010045144 A | * | 2/2010 | |
| JP | 2011193016 A | * | 9/2011 | |

OTHER PUBLICATIONS

Japanese Office Action dated Apr. 17, 2012 (Three (3) pages).
European Search Report dated Dec. 2, 2011 (Seven (7) pages).
Onozawa et al., Development of the next generation 1200V trench-gate FS-IGBT featuring lower EMI noise and lower switching loss, Proceedings of the 19th International Symposium on Power Semiconductor Devices & ICs, May 27-30, 2007, Jeju, Korea, pp. 13-16.
Japanese Office Action with partial English translation dated Feb. 5, 2013 (four (4) pages).
Chinese Office Action with partial English translation dated Dec. 21, 2012 (seven (7) pages).

* cited by examiner

SEMICONDUCTOR DEVICE AND POWER CONVERSION APPARATUS USING THE SAME

BACKGROUND OF THE INVENTION

The present invention relates to a semiconductor device and a power conversion apparatus using the same, and in particular to a semiconductor device preferred for an insulated gate bipolar transistor (hereinafter abbreviated to IGBT) having an insulated trench gate structure and a power conversion apparatus using the same.

The IGBT is a switching device for controlling a current to be flown between a collector electrode and an emitter electrode in response to a voltage applied to a gate electrode. Since electric power to be controlled by IGBT is ranged from several tens to several hundred thousand watts and switching frequency is ranging from several tens to over hundred kilohertz, the IGBT has been widely used from low electric power devices, such as an air-conditioner, microwave oven, etc. for household use to high electric power devices, such as an inverter for use in railroad rolling stock, steel plant, etc.

For the purpose of realizing a high efficiency operation of the electric devices, IGBT has been demanded for a low loss, that is, demanded for reduction of a conduction loss and a switching loss. At the same time, it has been demanded that dv/dt can be controlled to fit a specification for an application so as to prevent a problem, such as EMC noise, malfunction, breakdown of motors, etc.

Incidentally, JP-A-2000-307116 discloses IGBT having a structure in which an arrangement pitch of a trench gate is changed, as illustrated in FIG. 23. A feature of the IGBT in FIG. 23 is that a floating p-layer 105 is formed on a portion where the interval between the trench gates is wide, without forming a p-channel layer 106.

In the configuration as mentioned above, since a current is only flown into a portion where the interval between the trench gates is narrower, an over current flowing at a short circuit can be inhibited, therefore, a ruggedness of the device can be improved. Further, since a part of a hole current flows into an emitter electrode 114 via the floating p-layer 105, a hole concentration increases around the emitter electrode 114, therefore, there is also an advantage that an on-state voltage can be reduced. Furthermore, there is also an advantage that an electric field applied to the trench gate is relaxed by a p-n junction formed of the floating p-layer 105 and an n⁻ drift layer 104.

SUMMARY OF THE INVENTION

However, in the IGBT illustrated in FIG. 23, a problem sometimes occurs that controllability of the time change of an output voltage, dv/dt, of the IGBT and opposite-arm diode reduces when the IGBT turns on. FIG. 24 represents a simulated waveforms of the collector-emitter voltage vice during a turn-on operation. As illustrated in FIG. 24, there is a time period during which the control cannot be performed, that is, dvce/dt does not change even though a gate resistance is changed.

This reason is considered, as follows. When the IGBT turnes on, holes flow transiently into the floating p-layer 105 in FIG. 23, and an electric potential at the floating p-layer 105 becomes high. At this time, since a displacement current flows into a gate electrode 109 via a parasitic capacitance of a gate insulating layer 110 and thereby a gate voltage is raised, a time change of a collector current, dic/dt, determined by the product of a mutual conductance, gm, in a MOSFET structure and a time change of a voltage between the gate and emitter, dvge/dt, increases, and thereby, a switching speed is accelerated. The amount of holes transiently flown into the floating p-layer 105 is determined mainly by the structure inside the semiconductor. Therefore, it is difficult to control the amount of holes by an outside gate resistance.

Therefore, the accelerated dic/dt cannot be controlled by the outside gate resistance. As a result, the time period occurs during which dv/dt of the IGBT and the opposite-arm diode cannot be controlled by the gate resistance.

For the purpose of inhibiting the gate potential rise caused by the effect of the floating p-layer 105, the following methods have been proposed.

In JP-A-2004-39838, as illustrated in FIG. 25, the floating p-layer 105 is electrically connected to the emitter electrode 114 via a resistor 201, therefore, the electric potential rise at the floating p-layer 105 is inhibited.

In this way, the displacement current flowing into the gate electrode 109 from the floating p-layer 105 decreases, and therefore, inhibits the gate potential rise. As a result of this, the controllability of the dv/dt of the IGBT and the opposite-arm diode can be improved.

JP-A-5-243561 discloses that a wide trench gate is formed, as illustrated in FIG. 26, to enhance an injection of electrons from the trench gate, and therefore, the loss of the IGBT is reduced. Although JP-A-5-243561 does not explicitly specify, because of no floating p-layer, there is no gate potential variation caused by the effect of the floating p-layer, and therefore, the controllability of the dv/dt can be improved.

JP-A-2009-200103 discloses that a gate electrode 301 is formed on a lateral face of the trench and a space between the gate electrodes 301 is filled up with an insulating layer 302, and thereby the parasitic capacitance of a gate insulating layer 110 is reduced, as illustrated in FIG. 27. Therefore, the gate voltage rise can be controlled and the controllability of the dv/dt can be improved.

A document "Y. Onozawa, et al., Proc. 19$^{th}$ ISPSD, pp 13-16, 2007" discloses that, as illustrated in FIG. 28, a p base layer 106 electrically connected with the emitter electrode is alternately disposed toward a direction in parallel with the trench at every cell without using the floating p-layer. Therefore, there is no gate potential variation caused by the effect of the floating p-layer and the controllability of the dv/dt can be improved because the floating p-layer is not used.

Incidentally, it has been demanded that the dv/dt controllability by the gate drive circuit during a turn-on switching time period is improved while maintaining the low loss and high breakdown voltage in IGBT. For this problem, it was appreciated that the structure in the documents as mentioned above has the following improvement points.

In the JP-A-2004-39838, the smaller the resistance value of the resistor 201 between the floating p layer 105 and emitter electrode 114 becomes, the more the controllability of the dv/dt is improved. However, since a part of the hole current at on-state flows out to the emitter electrode 114 via the resistor 201, the effect of enhancing the injection of electrons becomes small, and thereby, the on-voltage is increased. Conversely, when increasing the resistance value of resistor 201, the on-voltage rise becomes small, while there is a problem that the controllability of the dv/dt is reduced.

In the JP-A-5-243561, there is a problem that, since the wide trench gate is formed and the parasitic capacitance of the gate is therefore large, a reverse transfer capacitance of IGBT becomes large, and thereby, a switching loss of IGBT and an electric power of the gate drive circuit is increased.

In the JP-A-2009-200103, there is a problem that the breakdown voltage and reliability become reduced, because the width of trench is made large to enhance the injection of electrons, and thereby, the electric field of the bottom of a gate electrode 301 formed on a lateral face is increased.

In the document "Y. Onozawa, et al., Proc. 19th ISPSD, pp 13-16 2007", there is a problem that the electric field applied to the gate electrode 109 increases and thereby the breakdown voltage and reliability is reduced, because the p base layers 106 are partially removed.

The present invention is made in light of the above-mentioned points. An object of the invention is to provide a semiconductor device capable of improving the dv/dt controllability by the gate drive circuit during the turn-on switching time period, while maintaining the low loss and high breakdown voltage, and to provide a power conversion apparatus using the same.

In order to achieve the above-mentioned object, a semiconductor device of the invention comprises: a first semiconductor layer of a first conductive type; a second semiconductor layer of a second conductive type formed in the vicinity of a surface of the first semiconductor layer; a third semiconductor layer of the second conductive type adjacent to the first semiconductor layer and formed in the vicinity of a surface of an opposite side of the second semiconductor layer; a fourth semiconductor layer of the first conductive type selectively formed on the third semiconductor layer; a trench penetrating through the fourth semiconductor layer and the third semiconductor layer into the first semiconductor layer; a gate insulating layer formed along an internal face of the trench; an insulating layer formed in the trench; a first conductive layer formed on a surface of the gate insulating layer; and a second conductive layer formed on a surface of the insulating layer, characterized in that the first conductive layer in the trench of at least one cross-sectional structure is divided by the insulating layer and the second conductive layer, a width "a" of the trench is wider than a width "b" of an area in which the trench is not formed, and the first conductive layer and the gate insulating layer are formed on a lateral face of the trench.

Further, a power conversion apparatus of the invention comprises: a pair of input terminals; a plurality of series connected circuits, connected between the input terminals, to which a plurality of semiconductor switching devices are connected in series; a plurality of output terminals each connected to a series connected point of each of the plurality of series connected circuits, and the plurality of semiconductor switching devices that turn on and off to perform a power conversion, characterized in that the plurality of semiconductor switching devices are above-mentioned semiconductor devices.

The semiconductor device and the power conversion apparatus using the same in the invention have an effect that the reverse transfer capacitance can be reduced, and thereby, the dv/dt controllability by the gate drive circuit during the turn-on switching time period can be improved, while maintaining the low loss and high breakdown voltage.

The other objects, aspects and advantages of the invention will become apparent from the following description of the embodiments of the invention taken in conjunction with the accompanying drawings.

DETAILED DESCRIPTION OF THE EMBODIMENTS

Hereinafter, a semiconductor device will be described in detail with reference to illustrated embodiments.

First Embodiment

Figure 1:
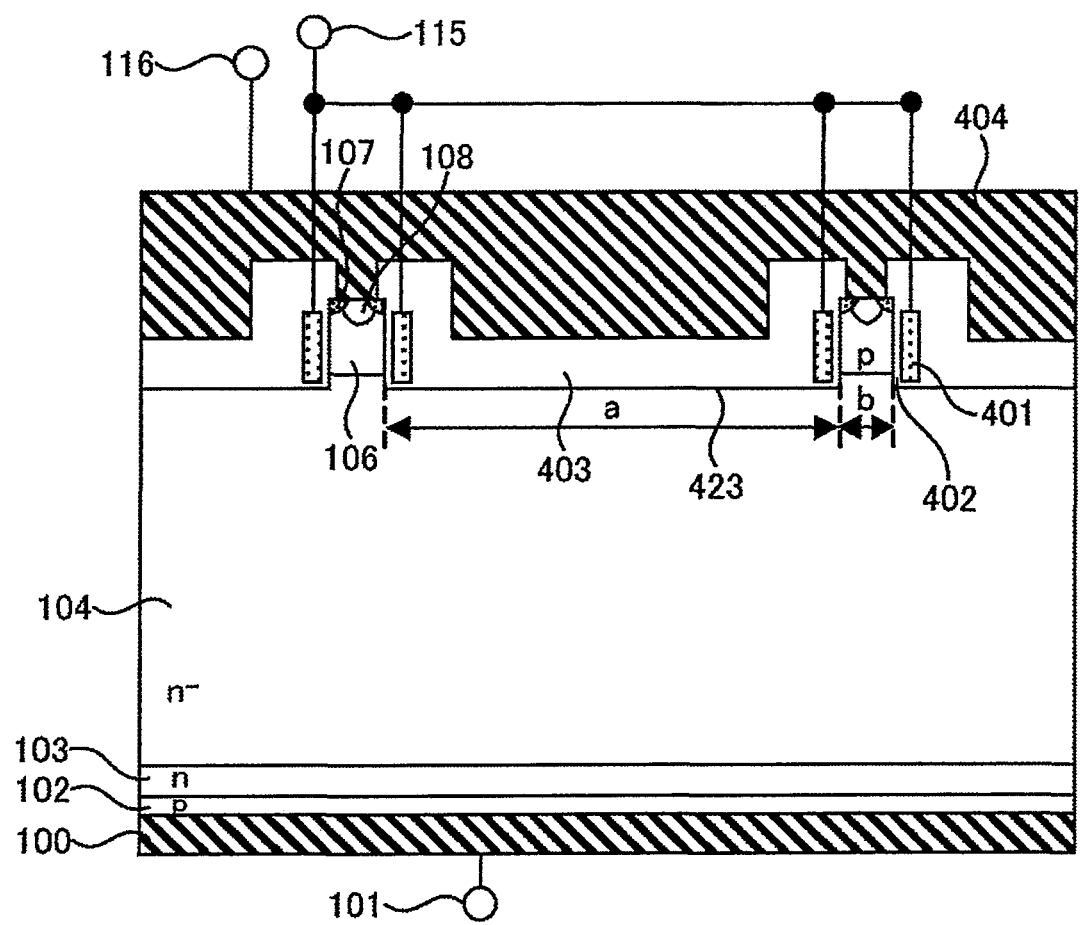
FIG. 1 is a cross-section diagram illustrating an IGBT as a semiconductor device according to a first embodiment of the invention.

FIG. 1 shows a cross-sectional structure of an IGBT in a first embodiment of the semiconductor device of the invention.

The IGBT illustrated in FIG. 1 is configured by: an $n^-$ drift layer 104 as a first semiconductor layer of a first conductive type; a p-collector layer 102 as a second semiconductor layer of a second conductive type formed in the vicinity of the surface of $n^-$ drift layer 104, and the layer 102 is contacted to a collector electrode 100; a p-channel layer 106 as a third semiconductor layer of the second conductive type adjacent to the $n^-$ drift layer 104 and formed in the vicinity of the surface of a reverse side of the layer 104 with respect to the side of p-collector layer 102; an n-emitter layer 107 as a fourth semiconductor layer of the first conductive type formed selectively on the p-channel layer 106; a trench 423 penetrating the n-emitter layer 107 and the p-channel layer 106 into the $n^-$ drift layer 104; a gate insulating layer 402 formed along an internal face of the trench 423; an insulating layer 403 formed in the trench 423; a gate electrode 401 as a first conductive layer formed on the surface of the gate insulating layer 402; an emitter electrode 404 as the second conductive layer formed on the surface of the insulating layer 403 and protruding partly in the trench 423 to the side of the $n^-$ drift layer 104; an n-buffer layer 103 formed between the p-collector layer 102 and the $n^-$ drift layer 104; and a p-contact layer 108 formed in the p-channel layer 106. In addition, a reference numeral 101 denotes a collector terminal, 115 denotes a gate terminal, and 116 denotes an emitter terminal.

Figure 23:
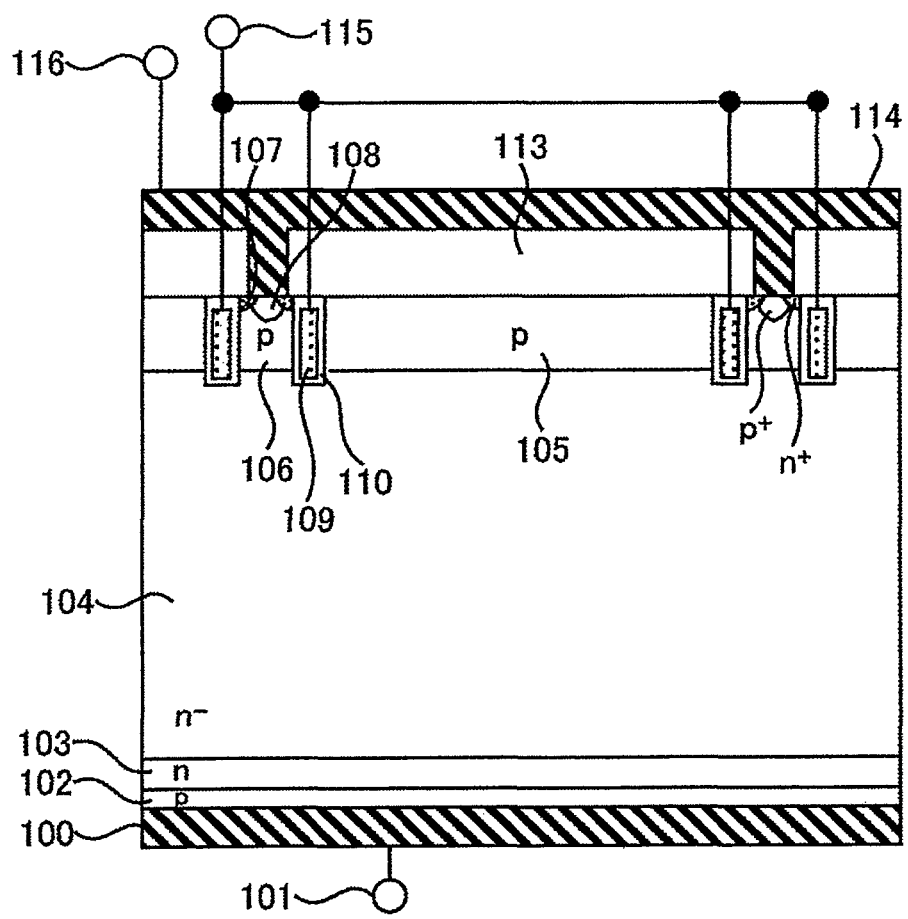
FIG. 23 is a cross-section diagram illustrating a conventional IGBT disclosed in the JP-A-2000-307116.

The IGBT of this embodiment has the cross-sectional structure in which the gate electrode 401 is divided by the insulating layer 403 and the emitter electrode 404 in the trench 423, as illustrated in FIG. 1. Further, a width "a" of the trench 423 is wider than a width "b" of an area in which the trench is not formed. A relation, a>b, is satisfied in FIG. 1, and the gate electrode 401 is formed on the lateral face of wide trench 423. Since the gate electrode 401 is covered by the gate insulating layer 402 and the thick insulating layer 403 (for example, the gate insulating layer 402 is as thick as 100 nm, and the insulating layer (inter layer) 403 is as thick as 1000 nm), a parasitic capacitance of the gate can be drastically reduced, compared with the conventional IGBT illustrated in FIG. 23. In the conventional IGBT, both sides of the gate are covered by a thin gate insulating layer. In contrast, in the structure of this embodiment, one side is covered by the gate insulating layer 402 and the other side is covered by the thick insulating layer 403, so that the parasitic capacitance of the thick inter layer side is reduced. A displacement current is given by (parasitic capacitance)×(potential variation of floating p-layer), that is, the smaller the parasitic capacitance, the smaller the displacement current. Therefore, the controllability of the dv/dt can be improved, because the potential rise in the gate is controllable due to the reduced displacement current.

Figure 2:
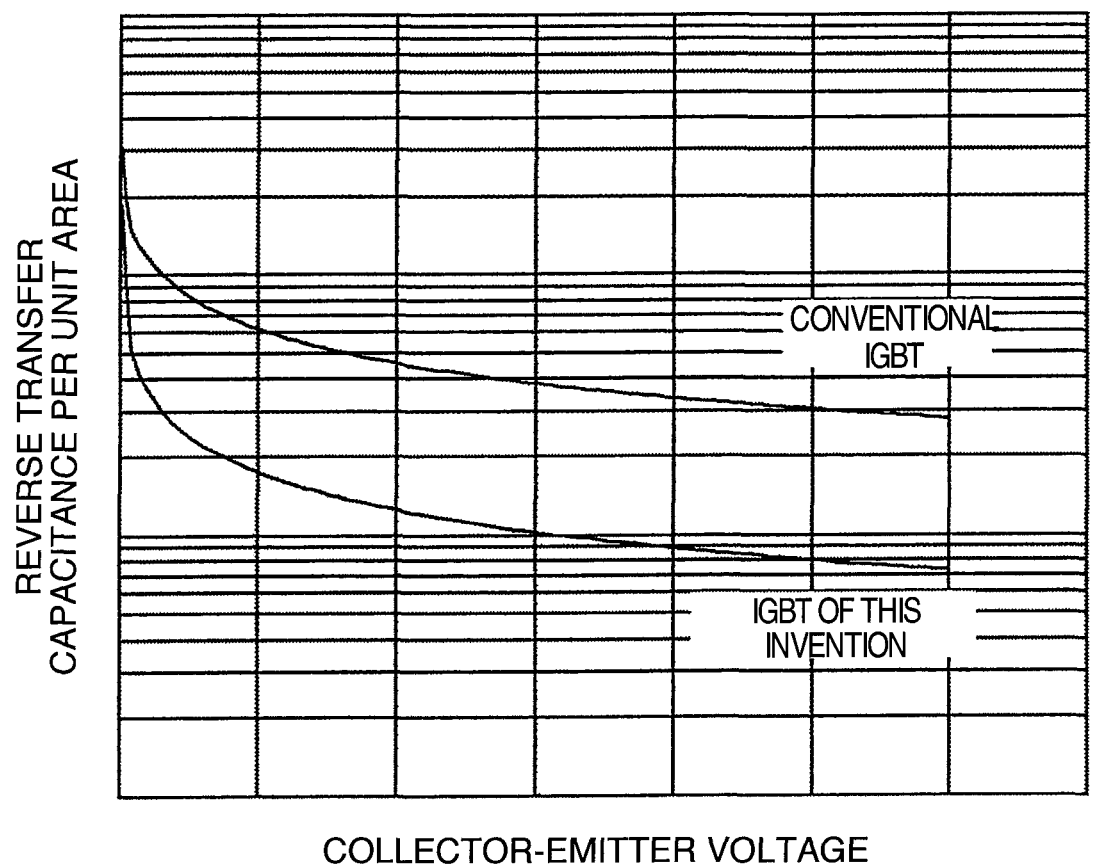
FIG. 2 is a simulated characteristic diagram representing a collector voltage dependency of the reverse transfer capacitances of the IGBT according to the first embodiment of the semiconductor of the invention and in the JP-A-2000-307116.

FIG. 2 represents a simulated result of a collector voltage dependency of a reverse transfer capacitance for the IGBT in this embodiment of the invention and the conventional IGBT. The parasitic capacitance of the gate is a reverse transfer capacitance component of the IGBT, so that the reverse transfer capacitance is reduced if the parasitic capacitance is reduced. As is apparent from FIG. 2, in the IGBT of the first embodiment of the invention, the reverse transfer capacitance is reduced up to approximately ¼ in comparison with the conventional IGBT.

Further, the IGBT in the first embodiment of the invention does not form the floating p-layer which has been formed in the conventional IGBT, therefore, there is no gate potential variation caused by an effect of the floating p-layer and the controllability of the dv/dt can be improved. A reduction of the breakdown voltage and the reliability is concerned about because the floating p-layer is not formed. However, the emitter electrode 404 is formed to protrude in the trench to the $n^-$ drift layer 104 (the gate electrode 401 is divided by the emitter electrode 404 and the insulating layer 403), therefore, the reduction of the breakdown voltage and reliability can be prevented, because the emitter electrode 404 acts as a field plate which relaxes the electric field applied to a corner portion of the gate electrode 401.

Figure 3:
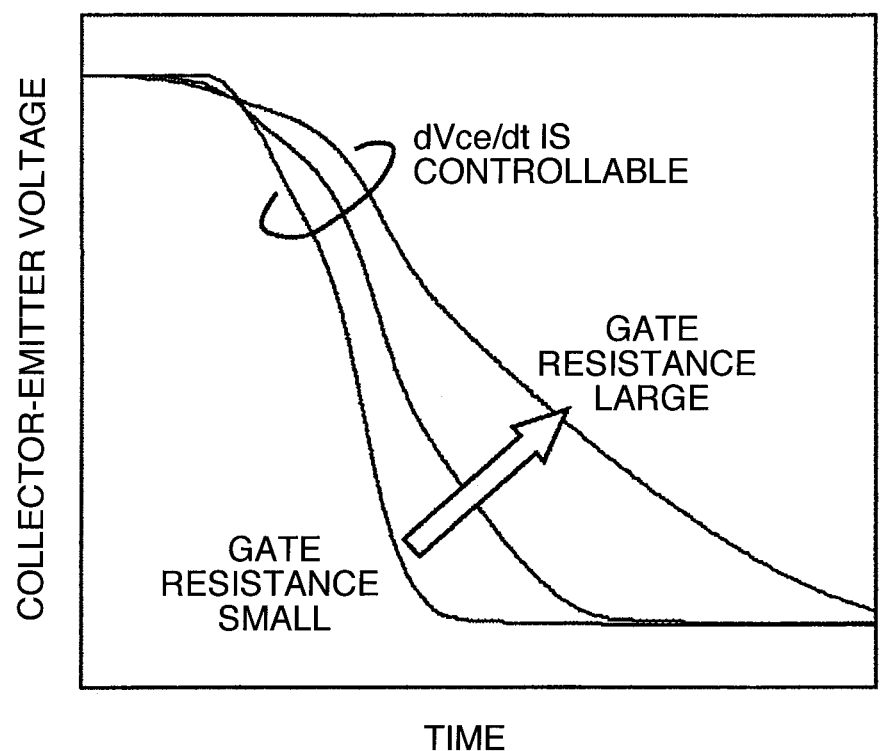
FIG. 3 is a characteristic diagram illustrating the simulated waveforms of collector-emitter voltage during the turn-on operation of an IGBT according to the first embodiment of the semiconductor of the invention.
Figure 24:
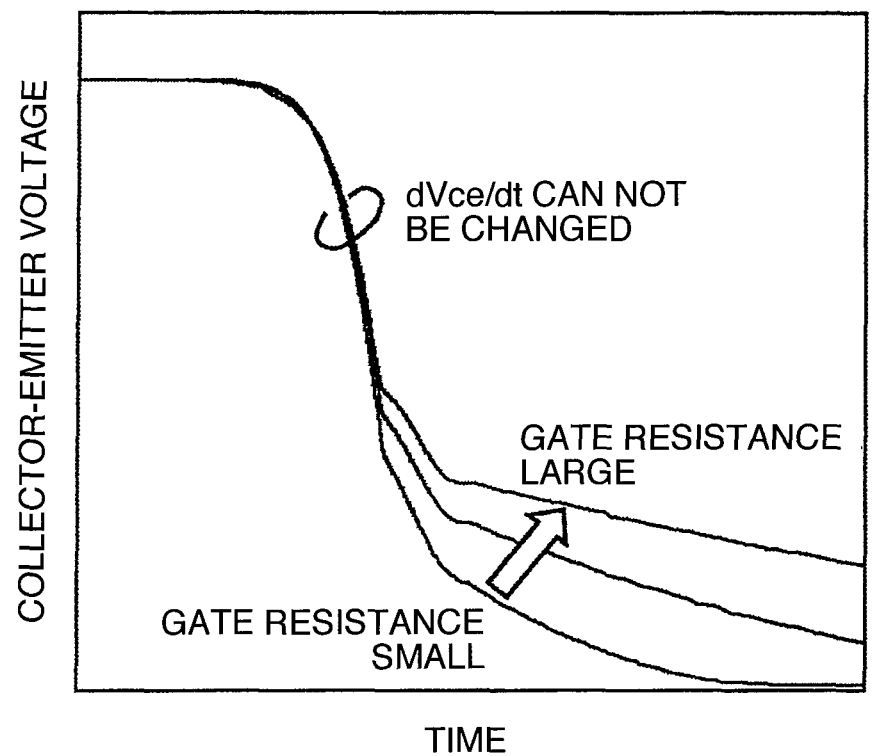
FIG. 24 is a characteristic diagram illustrating a simulated waveforms of the collector-emitter voltage during the turn-on operation of the conventional IGBT disclosed in the JP-A-2000-307116.
Figure 25:
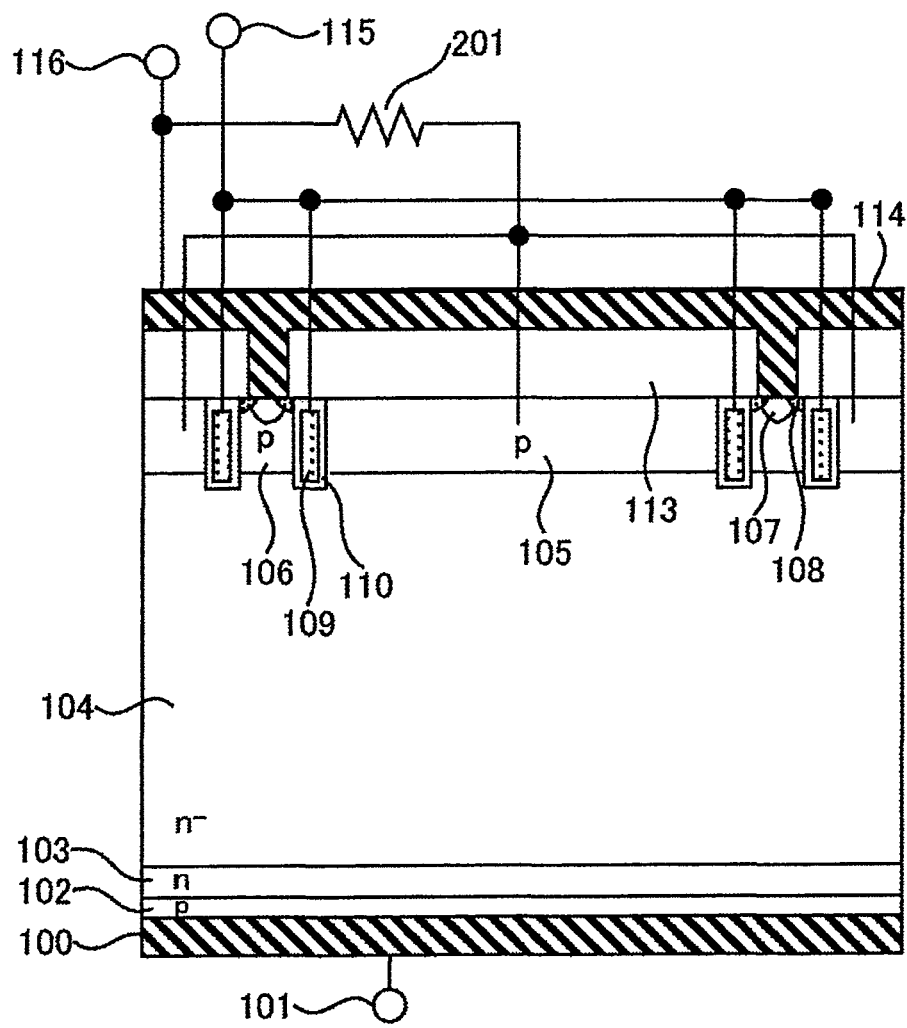
FIG. 25 is a cross-section diagram illustrating the conventional IGBT disclosed in the JP-A-2004-39838.
Figure 26:
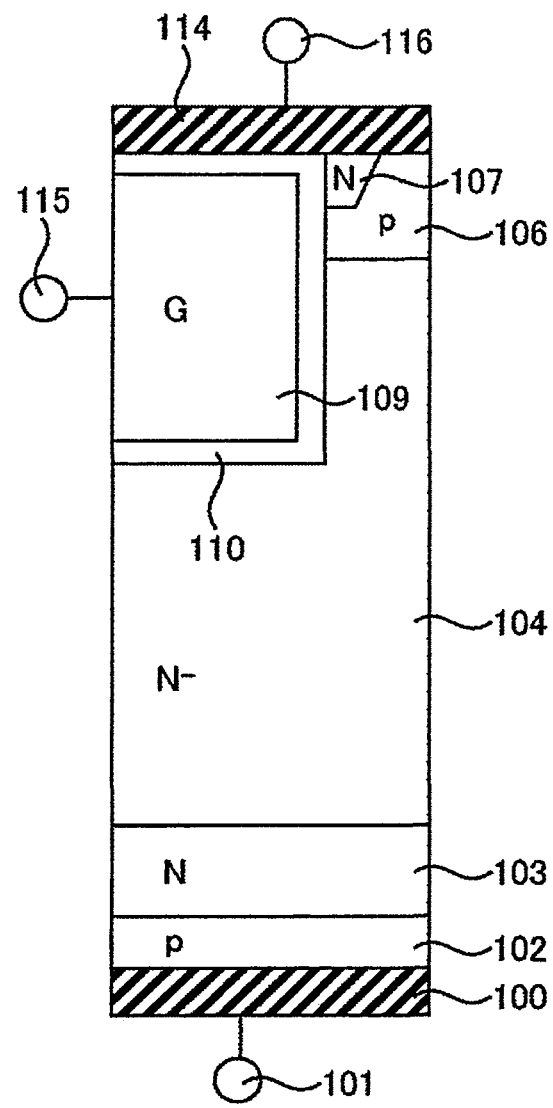
FIG. 26 is a cross-section diagram illustrating the conventional IGBT disclosed in the JP-A-5-243561.
Figure 27:
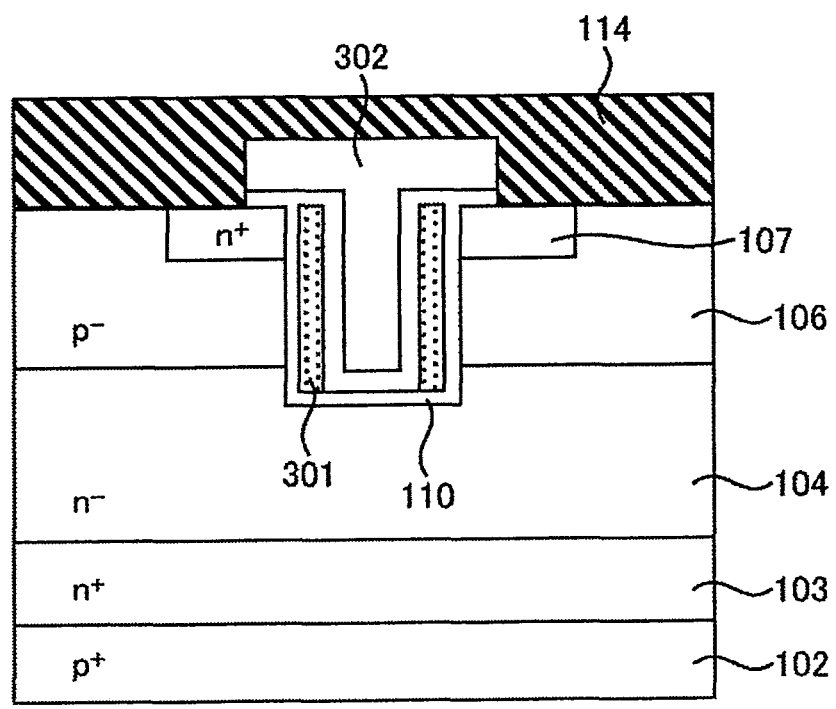
FIG. 27 is a cross-section diagram illustrating the conventional IGBT disclosed in the JP-A-2009-200103.
Figure 28:
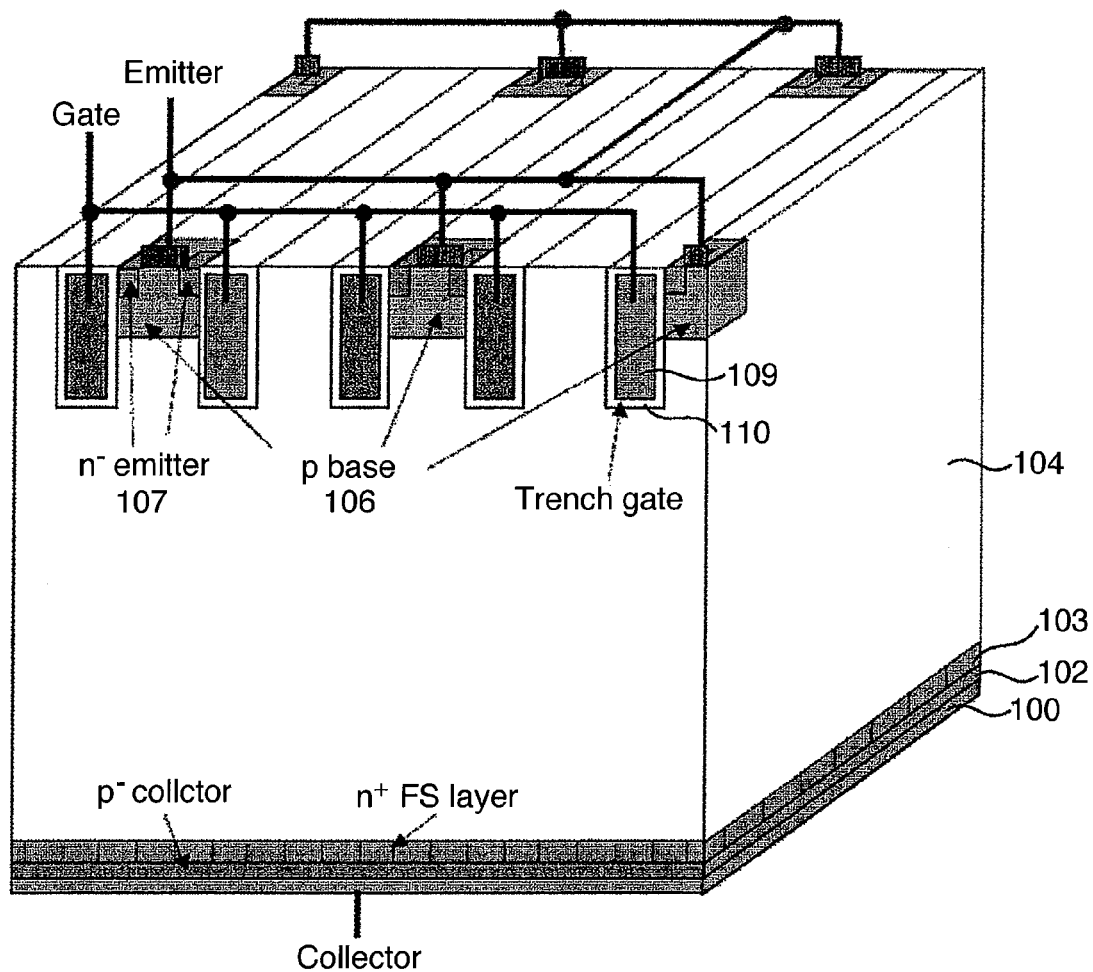
FIG. 28 is a perspective diagram illustrating a partly broken portion of the conventional IGBT disclosed in the document "Y. Onozawa, et al., Proc. 19th ISPSD, pp 13-16 2007"

FIG. 3 illustrates simulated waveforms of the collector—emitter voltage, vice, on the turn-on operation of the IGBT according to the first embodiment of the invention. As is apparent from FIG. 3, in the IGBT of the first embodiment of the invention, it is appreciated that dvce/dt can be controlled by varying a gate resistance, unlike the case of the conventional IGBT illustrated in FIG. 24.

Figure 4:
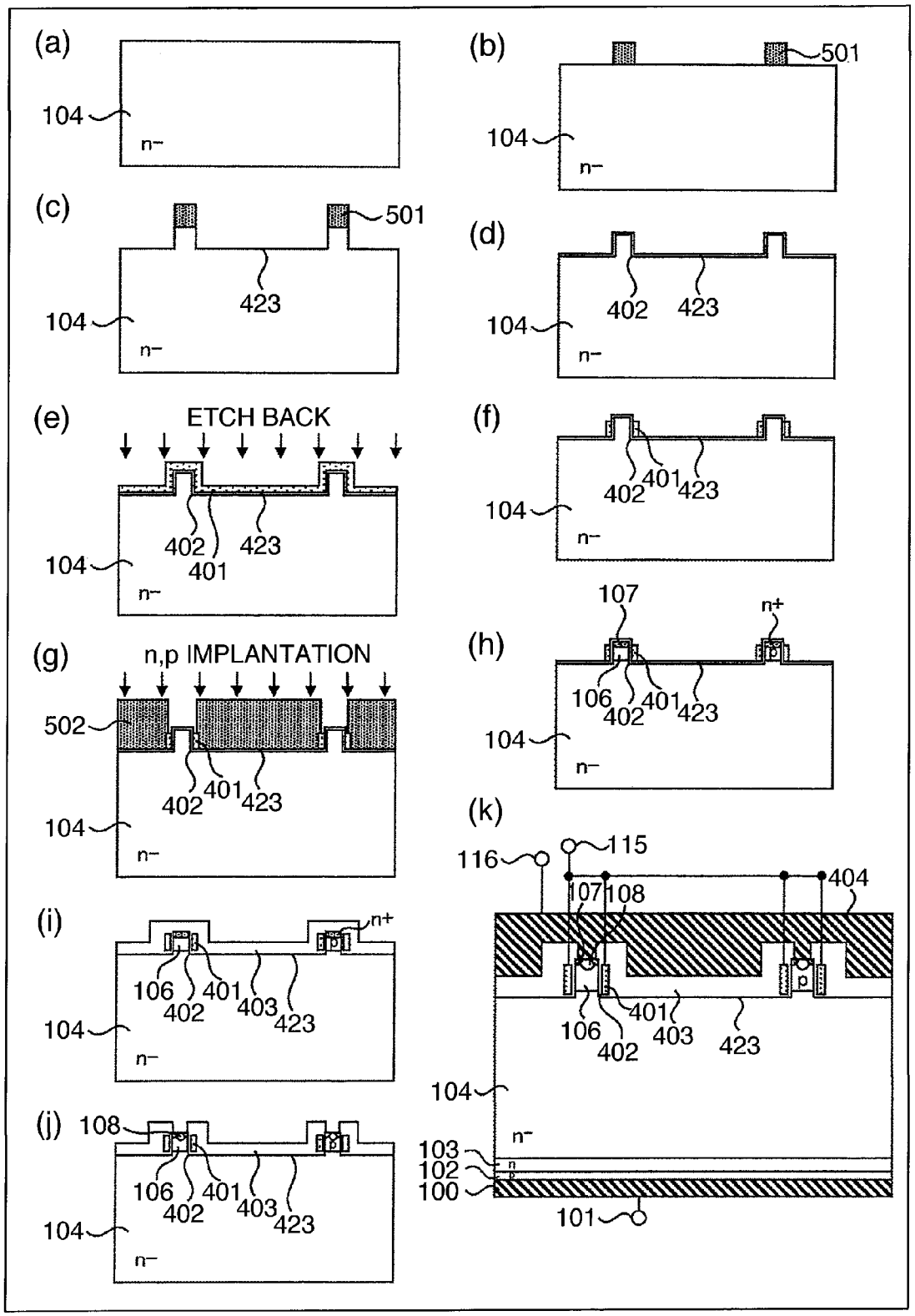
FIG. 4 is a diagram illustrating a manufacturing process of an IGBT according to the first embodiment of the semiconductor of the invention.

In FIG. 4, (a) to (k) illustrate an example of a manufacturing process of the IGBT according to the first embodiment of the invention. First, a pattern as illustrated in (b) is formed on then drift layer 104 illustrated in (a) using a photoresist 501, and the wide trench 423 is formed by an anisotropic etching as illustrated in (c). Next, the gate insulating layer 402 is formed as illustrated in (d), and polysilicon as a material of the gate electrode 401 is deposited, as illustrated in (e), to then be etched back by the anisotropic etching and form the gate electrode 401 made up of the polysilicon on the lateral face of the trench 423 as a sidewall, as illustrated in (f). Next, a pattern is formed using a photoresist 502 as illustrated in (g), and an ion implantation of p-type and n-type is performed to form the p-channel layer 106 and n-emitter layer 107 as illustrated in (h). Subsequently, the insulating layer 403 is deposited as illustrated in (i), a contact hole formed and the p-contact layer 108 is formed as illustrated in (j). Finally, the emitter electrode 404, the n-buffer layer 103, the p-collector layer 102 and the collector electrode 100 are formed, as illustrated in (k), and thus the process is completed.

In this embodiment, the collector terminal 101 and the p-collector layer 102 on the reverse face are formed after the surface process, however, an epitaxial-substrate on which the p-collector layer 102 are initially formed may be used.

As mentioned above, the gate electrode 401 is formed on the lateral face of the wide trench 423 in the IGBT in the first embodiment of the invention, so that the parasitic capacitance of the gate is reduced, and the dv/dt controllability by the gate drive circuit during the turn-on switching time period can be improved.

Second Embodiment

Figure 5:
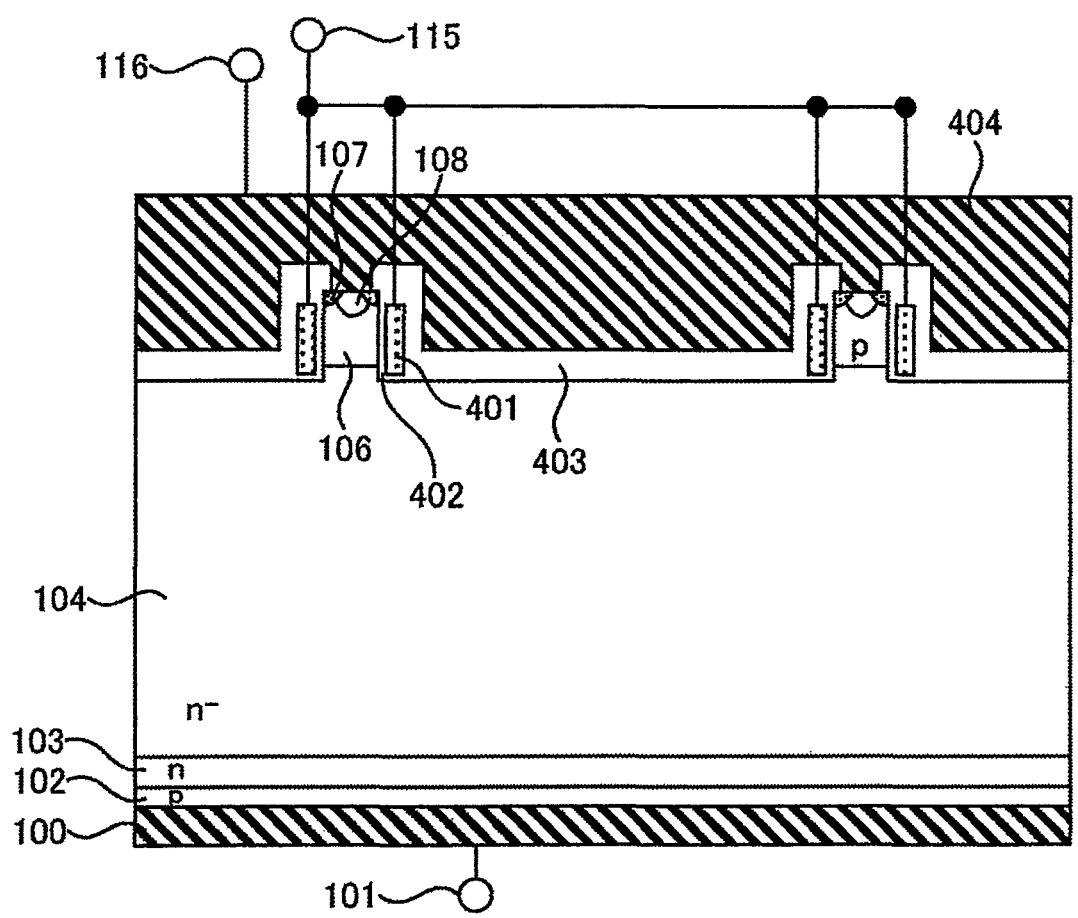
FIG. 5 is a cross-section diagram illustrating an IGBT according to a second embodiment of the semiconductor of the invention.

FIG. 5 illustrates a cross-sectional structure of an IGBT according to a second embodiment of the invention. A feature of the IGBT in the second embodiment is that an insulating layer 403 is thinner than the thickness of the insulating layer 407 (refer to FIG. 6) in a termination area (not shown, peripheral area of chip), and thereby enhance the field plate effect caused by the emitter electrode 404 and a higher breakdown voltage can be realized. As illustrated in FIG. 5, as the corner portion (corner portion close to the emitter electrode 404 and on the lower side of the gate electrode 401) of the gate electrode 401 and an end portion (corner portion mostly close to the gate electrode 401) of the emitter electrode 404 become closer with each other, the field plate effect becomes higher. In consequence, the high breakdown voltage of the IGBT can be obtained.

Figure 6:
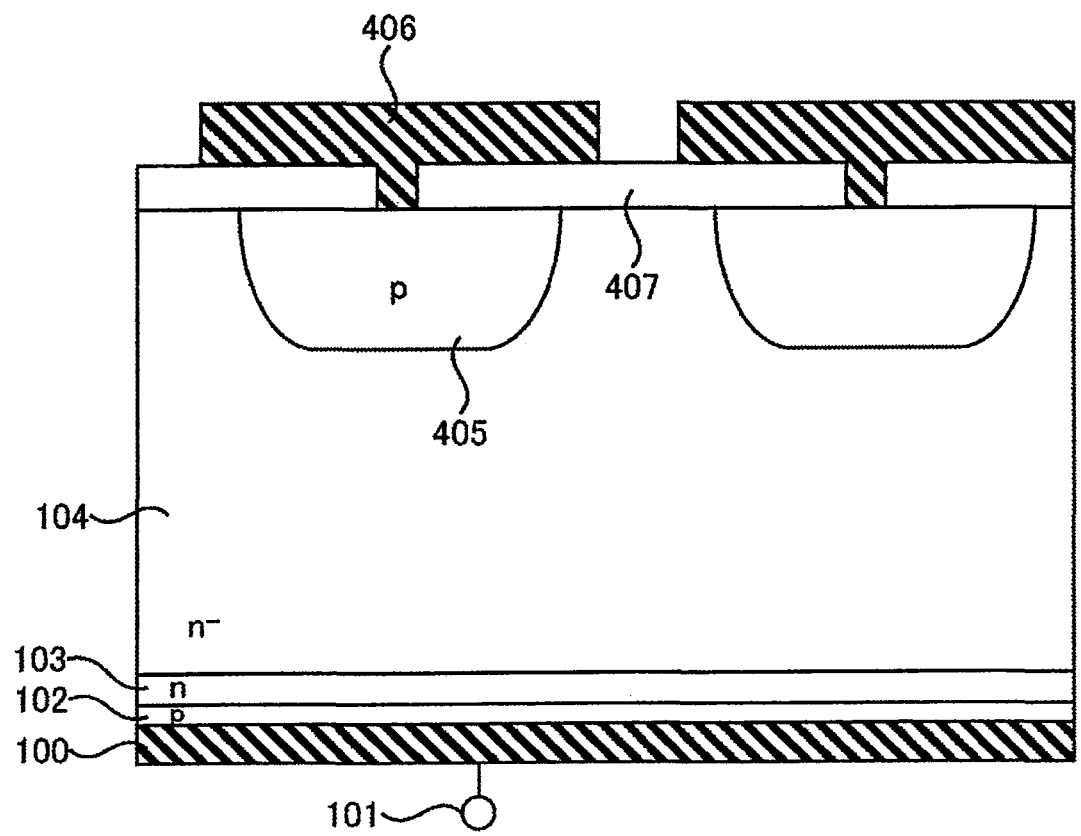
FIG. 6 is a cross-section diagram of a termination area of an IGBT according to the second embodiment.

However, in the termination area of the IGBT made up of a p-layer 405 and a floating electrode 406 as illustrated in FIG. 6, if the insulating layer 407 becomes thin (similar extent to the insulating layer 403 as illustrated in FIG. 5), the electric field in the insulating layer 407 becomes high and thereby reduces the breakdown voltage in the termination area. In the second embodiment, the insulating layer 403 in an active area (area in FIG. 5) of the IGBT is thinner than the thickness of the insulating layer 407 in the termination area. In consequence, there is an advantage that both the active area and the termination area can maintain the high breakdown voltage. That is, the breakdown voltage of the active area is improved by using the thin insulating layer 403, while the breakdown voltage of the termination area is improved by using the thick insulating layer 407. Therefore, the feature of this embodiment is that the thickness of the insulating layer in the two areas is changed.

Figure 29:
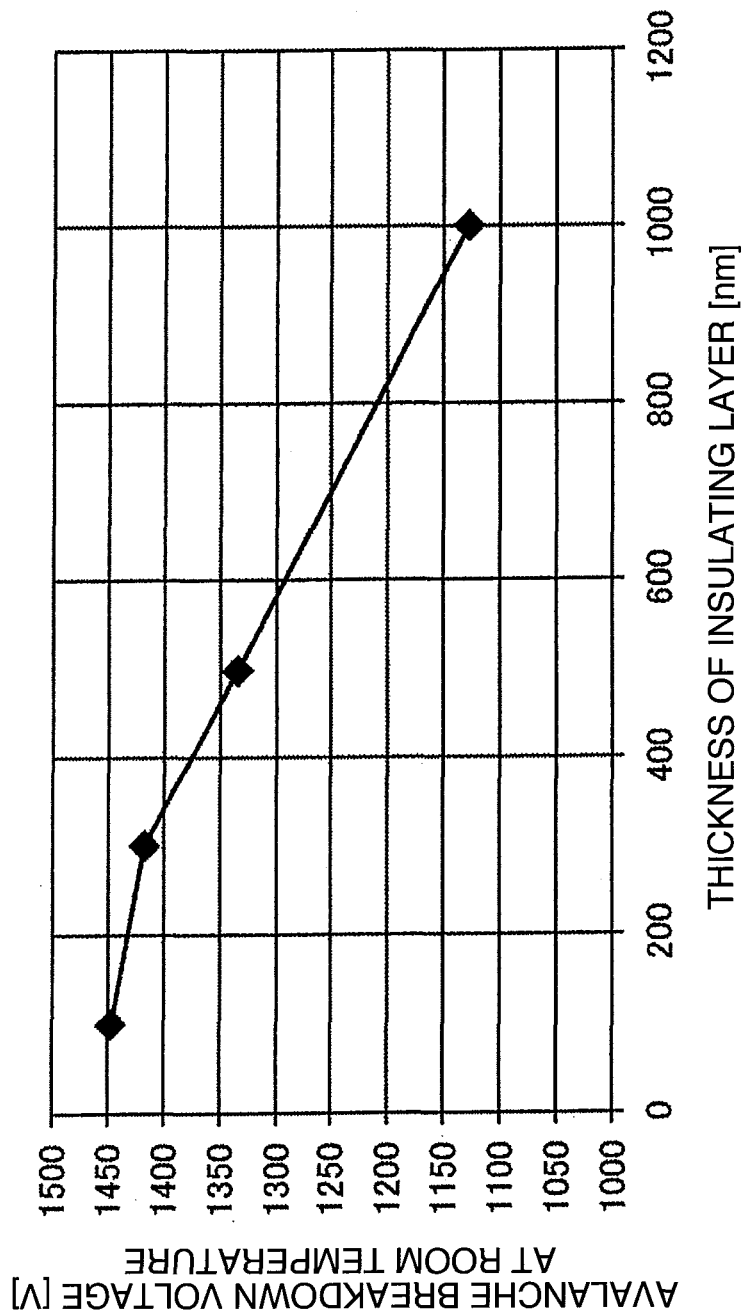
FIG. 29 is a characteristic diagram for explaining grounds of a thickness of the insulating layer in the second embodiment.

Specifically, it is desirable that the thickness of the insulating layer 403 ranges from 300 nm to 1000 nm and the thickness of insulating layer 407 is equal to or greater than 1000 nm. As illustrated in FIG. 29, the breakdown voltage continues to improve in the range from 300 nm to 1000 nm in thickness of the oxide layer (insulating layer 403) and is saturated at an equal to or less than 300 nm in thickness. Further, if the oxide layer is too thin, impurities diffuse up to an Si-layer under the insulating layer when implanting ions. Therefore, the extent of around 300 nm is desirable.

Third Embodiment

Figure 7:
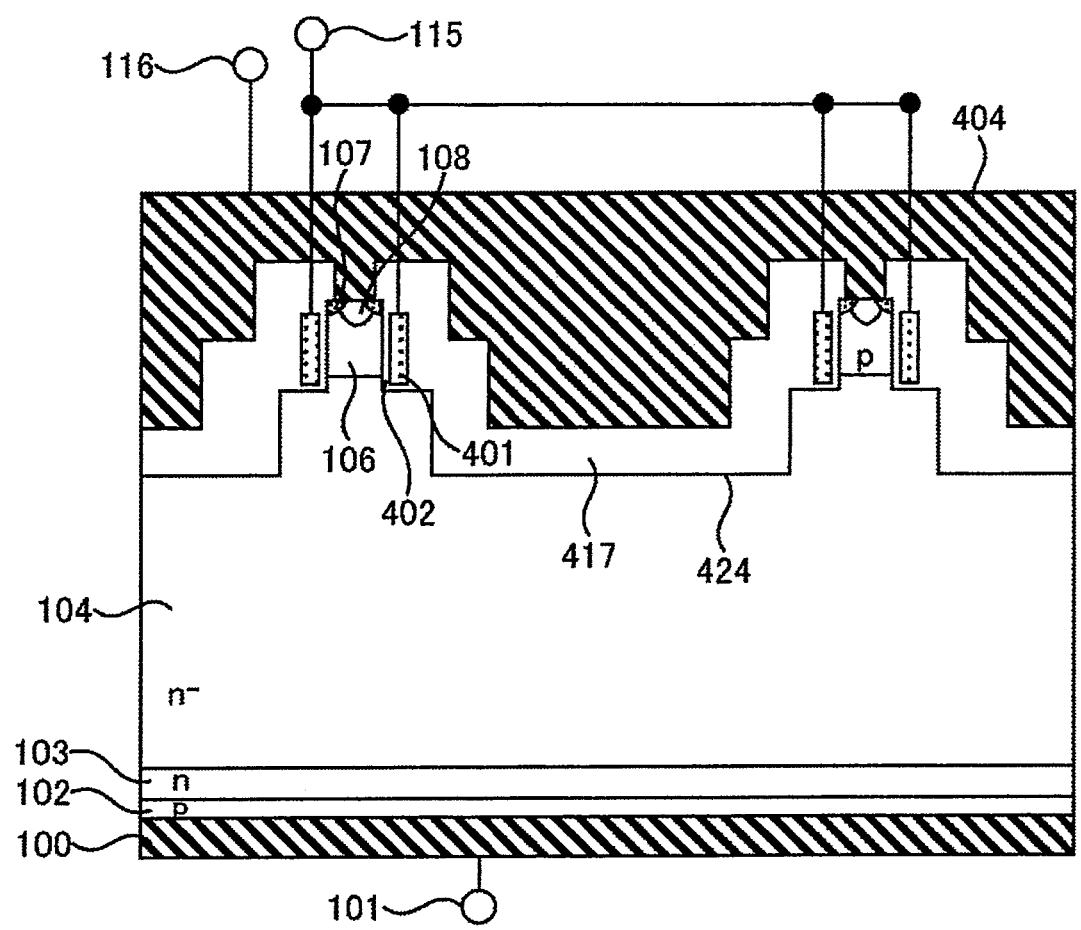
FIG. 7 is a cross-section diagram illustrating an IGBT according to a third embodiment of the semiconductor of the invention.

FIG. 7 illustrates a cross-sectional structure of an IGBT according to a third embodiment of the invention. A feature of the IGBT in the third embodiment is that a trench 424 has a two step staircase pattern, and then drift layer 104 side of the emitter electrode 404 protrudes deeper than the corner portion of the gate electrode 401.

By forming the structure as in the third embodiment as mentioned above, the electric field applied to the corner portion of the gate electrode 401 is dispersed by then drift layer 104 side of the emitter electrode 404 and the corner portion of the trench 424, so that a higher breakdown voltage can be obtained from the same reason as described in the second embodiment.

Fourth Embodiment

Figure 8:
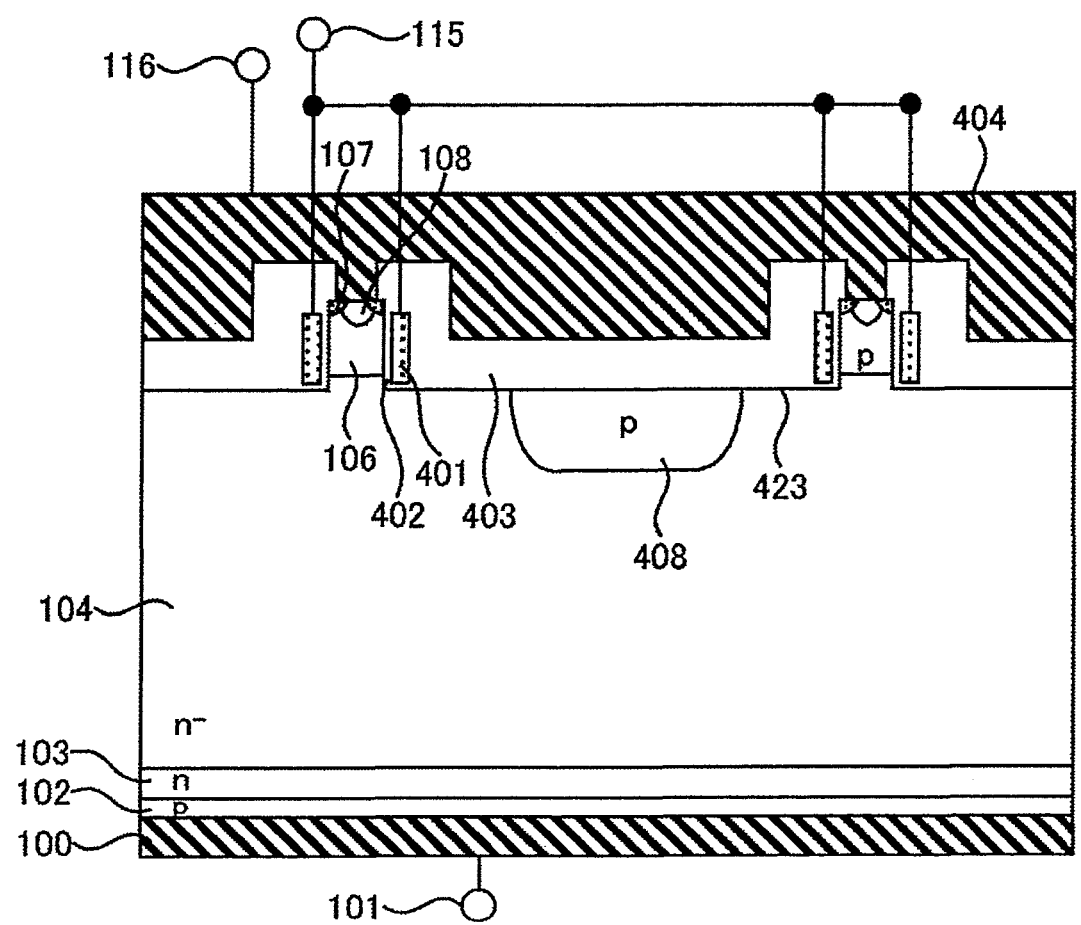
FIG. 8 is a cross-section diagram illustrating an IGBT according to a fourth embodiment of the semiconductor of the invention.
Figure 9:
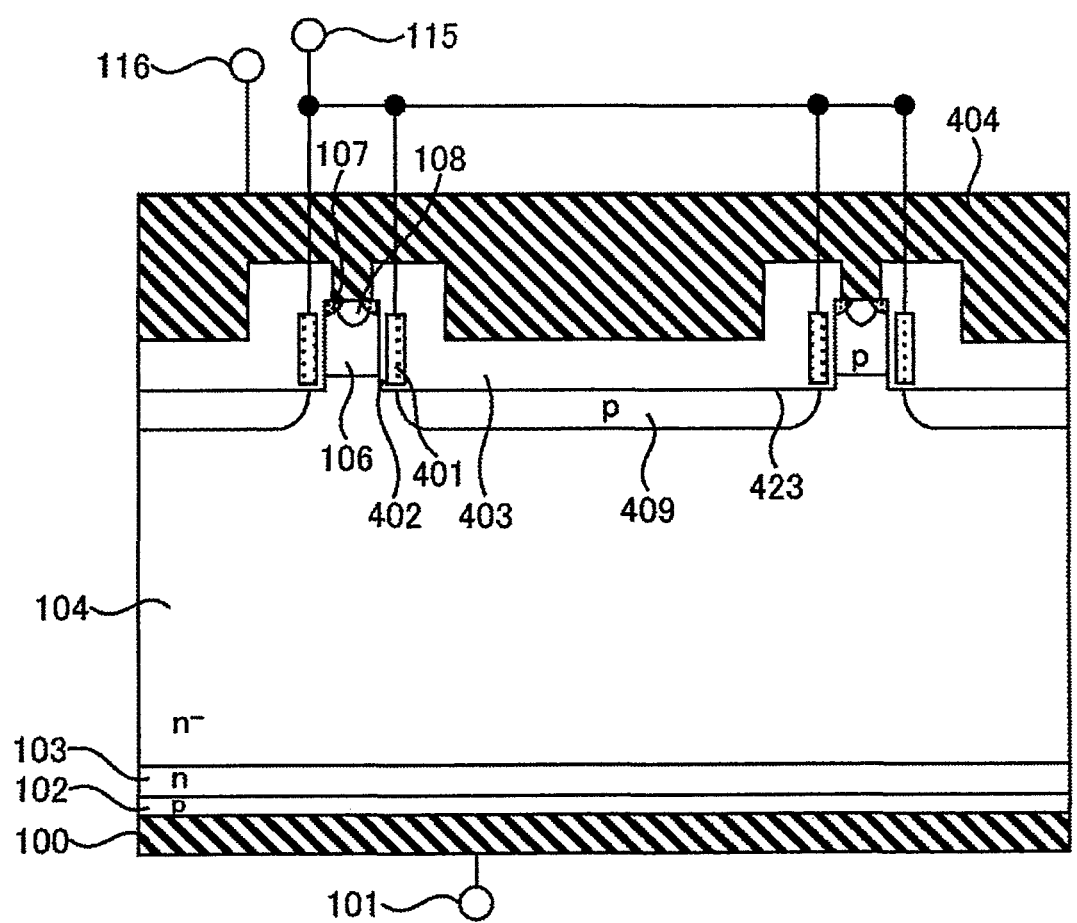
FIG. 9 is a cross-section diagram illustrating an IGBT according to an example of the fourth embodiment of the semiconductor of the invention.
Figure 10:
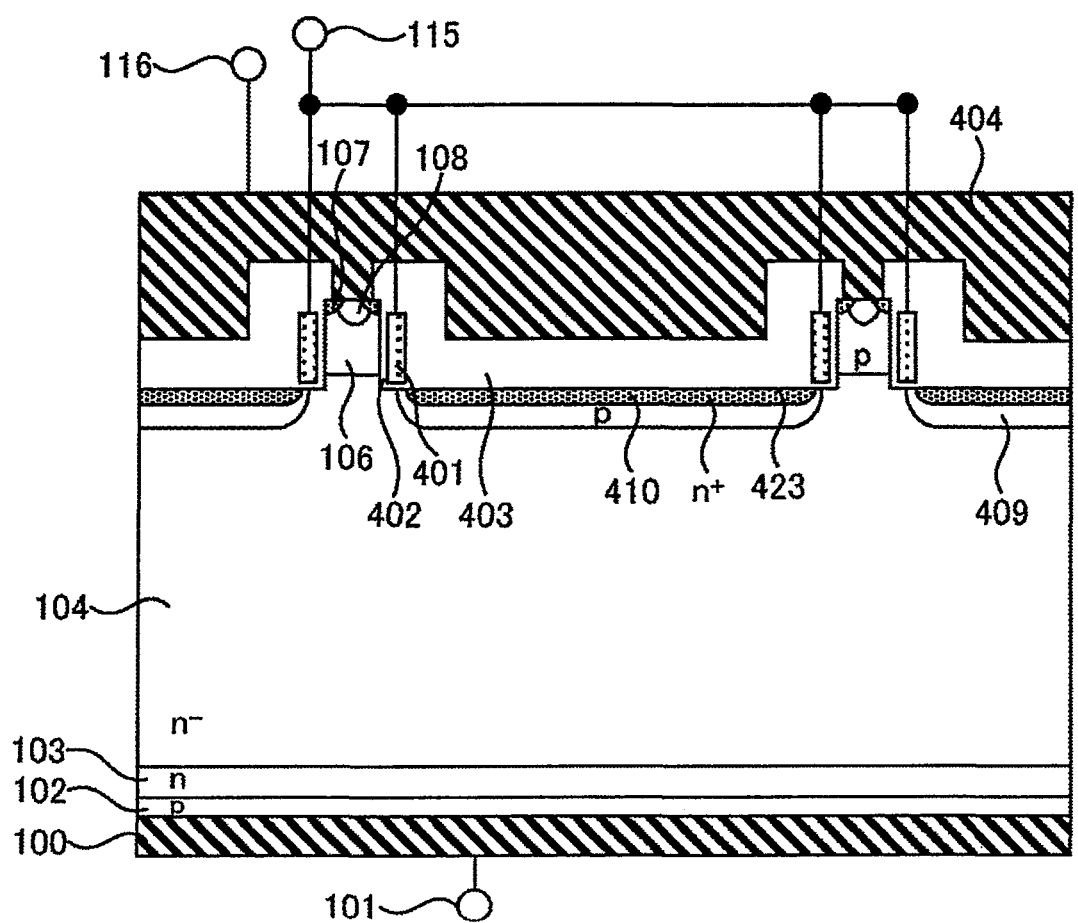
FIG. 10 is a cross-section diagram illustrating an IGBT according to an other example of the fourth embodiment of the semiconductor of the invention.

FIG. 8 to FIG. 10 illustrate a cross-sectional structure of an IGBT according to a fourth embodiment of the invention. A feature of the IGBT in the fourth embodiment is that a p-layer is inserted underneath the trench 423 to thereby allow a depletion layer to extend from the p-layer. Therefore, the electric fields at the corner portion of the gate electrode 401 and a trench corner portion are relaxed, so that a higher breakdown voltage can be obtained. In FIG. 8, a p-layer 408 is partly inserted underneath trench 423. In FIG. 9, a p-layer 409 is inserted so as to cover the corner portion of the gate electrode 401. In FIG. 10, an n-layer 410 is inserted into the p-layer 409. The n-layer 410 in FIG. 10 prevents holes from flowing into the floating p-layer 409 during the turn-on operation. In fact, since less holes flow into the n-layer by forming the n-layer inside the p-layer, the holes to flow into the floating layer are reduced. In consequence, there is an advantage that the potential rise in the floating p-layer is inhibited.

Fifth Embodiment

Figure 11:
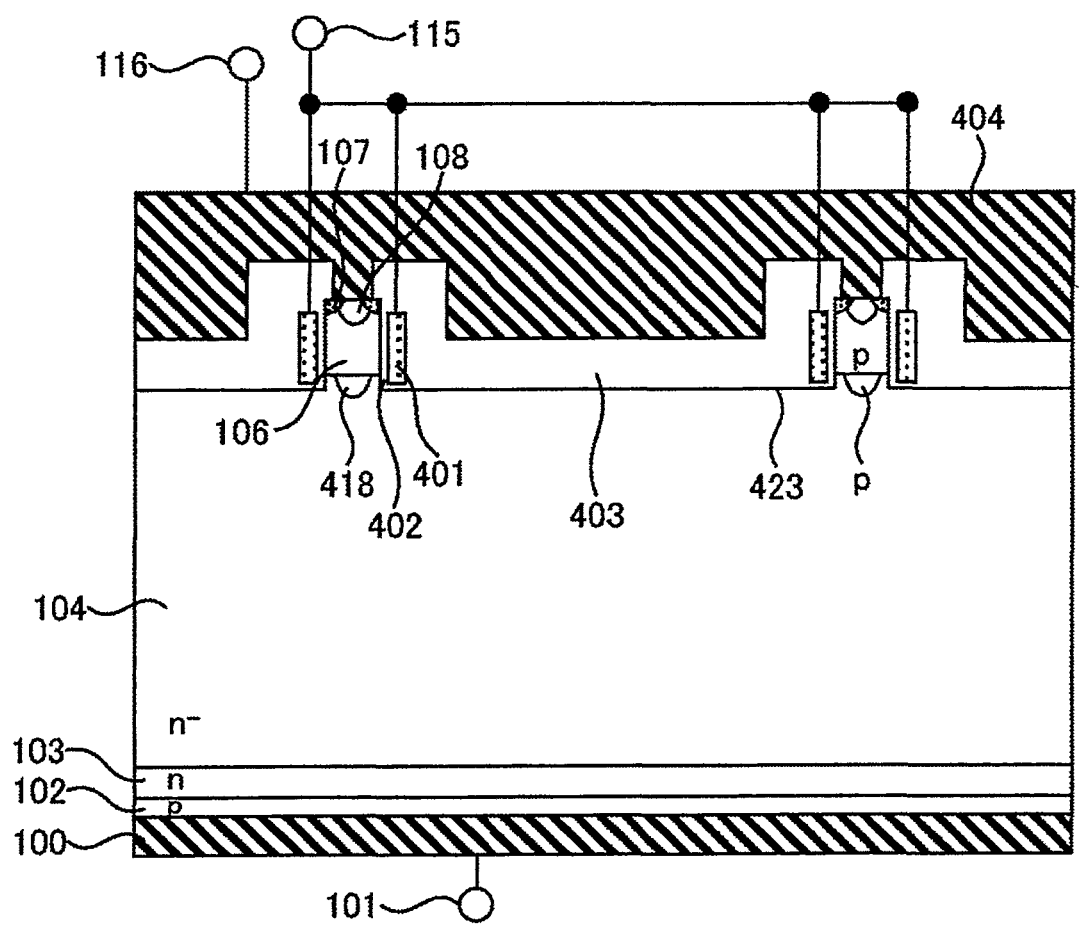
FIG. 11 is a cross-section diagram illustrating an IGBT according to a fifth embodiment of the semiconductor of the invention.
Figure 12:
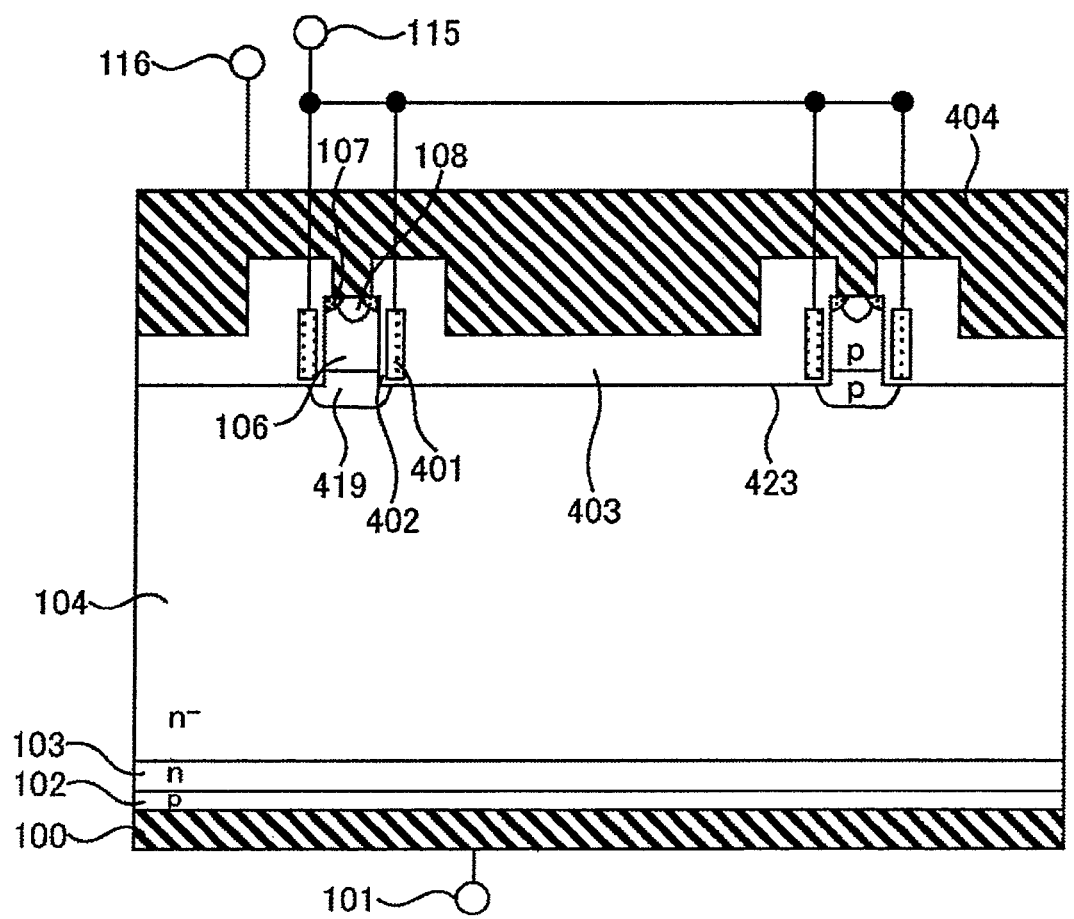
FIG. 12 is a cross-section diagram illustrating an IGBT according to an example of the fifth embodiment of the semiconductor of the invention.
Figure 13:
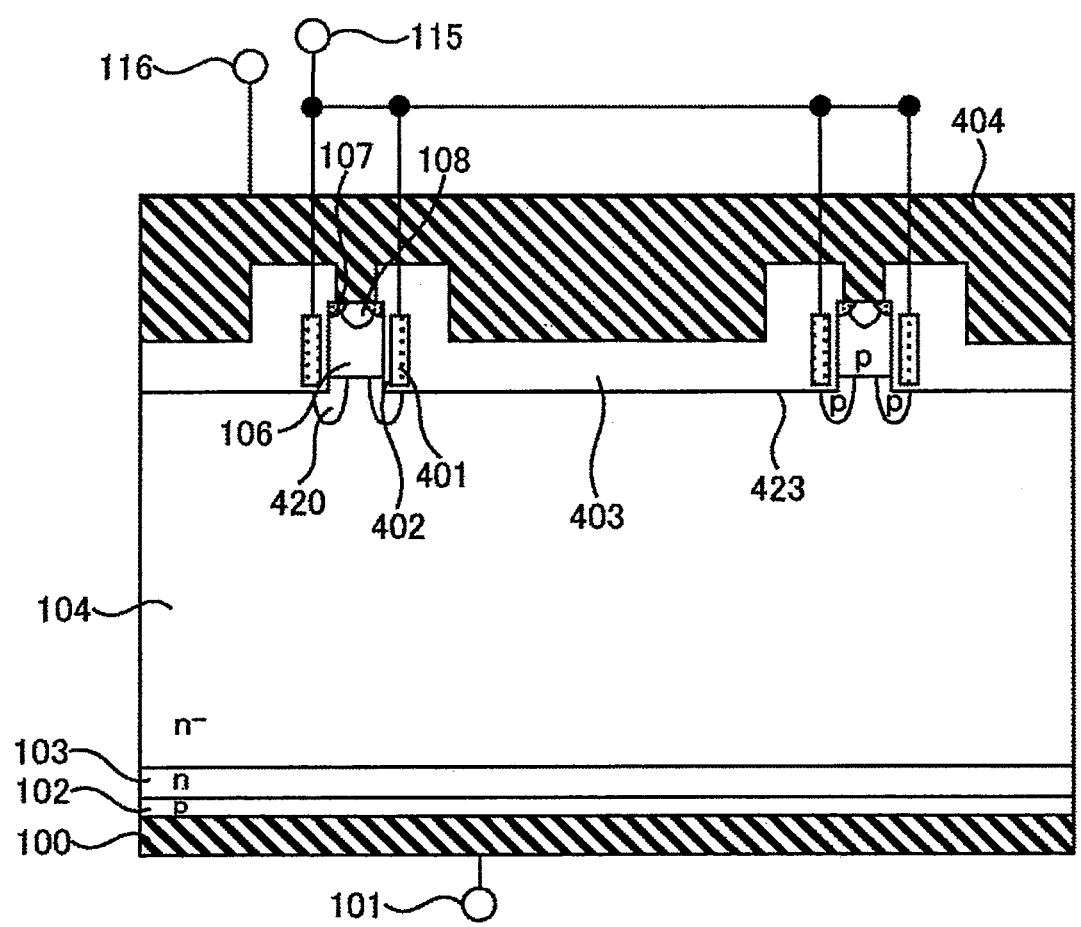
FIG. 13 is a cross-section diagram illustrating an IGBT according to an other example of the fifth embodiment of the semiconductor of the invention.

FIG. 11 to FIG. 13 illustrate a cross-sectional structure of an IGBT according to a fifth embodiment of the invention. A feature of the IGBT in the fifth embodiment is that a p-layer 418 is formed underneath the p-channel layer 106. In consequence, the electric field at the corner of gate electrode 401 is relaxed, so that a higher breakdown voltage can be obtained. In FIG. 11, it is configured that the p-layer 418 is inserted underneath the p-channel layer. In FIG. 12, a p-layer 419 is inserted so as to cover the corner portion of the gate electrodes 401. In FIG. 13, a p-layers 420 are inserted so as to cover each one of the corner of the gate electrode 401.

Sixth Embodiment

Figure 14:
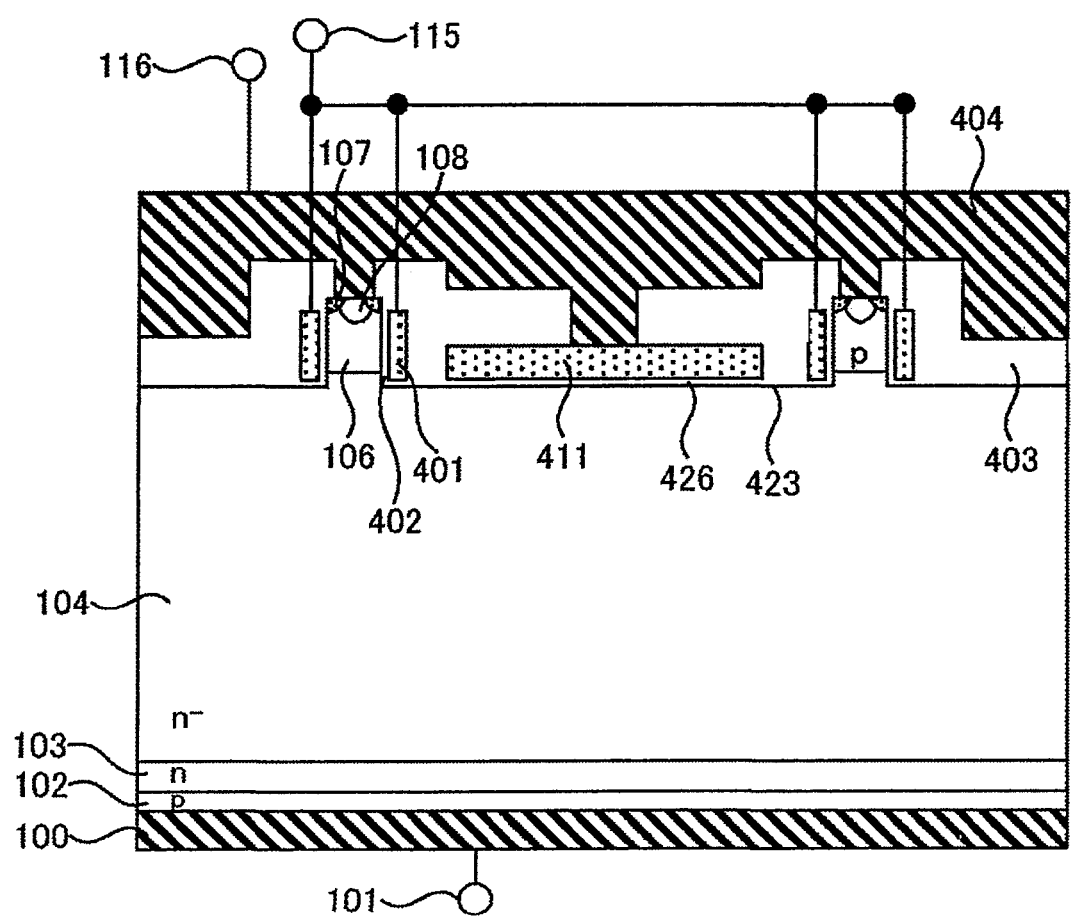
FIG. 14 is a cross-section diagram illustrating an IGBT according to a sixth embodiment of the semiconductor of the invention.

FIG. 14 is a cross-sectional structure of an IGBT according to a sixth embodiment of the invention. A feature of the IGBT in the sixth embodiment is that a capacitor made up of an insulating layer 426 and a polysilicon electrode 411 is formed on the trench 423. The polysilicon electrode 411 is connected to the emitter electrode 404. Since a part of hole current flowing underneath the trench 423 during the turn-on is used for charging up the capacitor, the potential rise underneath the trench 423 is inhibited. In consequence, there is an advantage that the gate potential rise can be reduced. Since the polysilicon electrode 411 acts as the field plate to relax the electric field at the corner portion of the gate electrode 401, there is also the advantage that the high breakdown voltage can be obtained.

Seventh Embodiment

Figure 15:
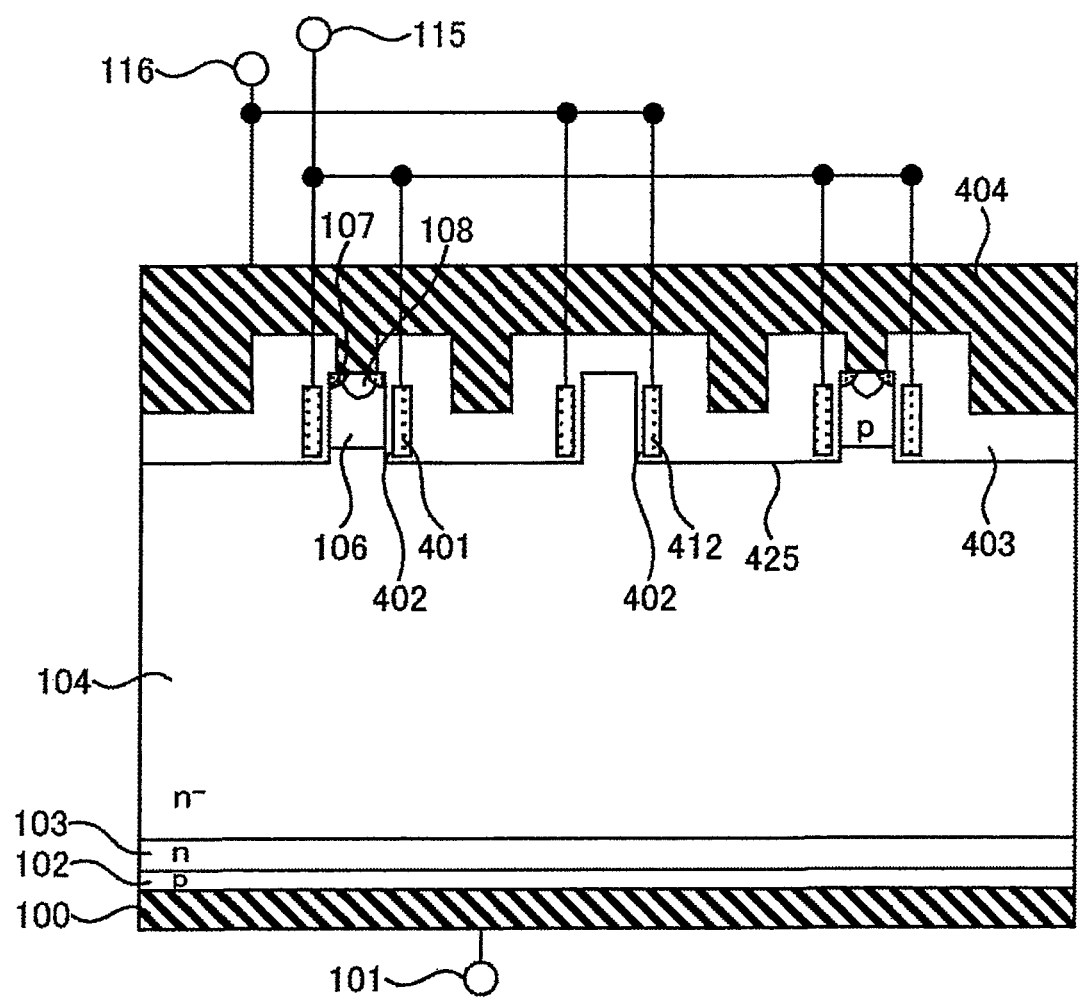
FIG. 15 is a cross-section diagram illustrating an IGBT according to a seventh embodiment of the semiconductor of the invention.
Figure 16:
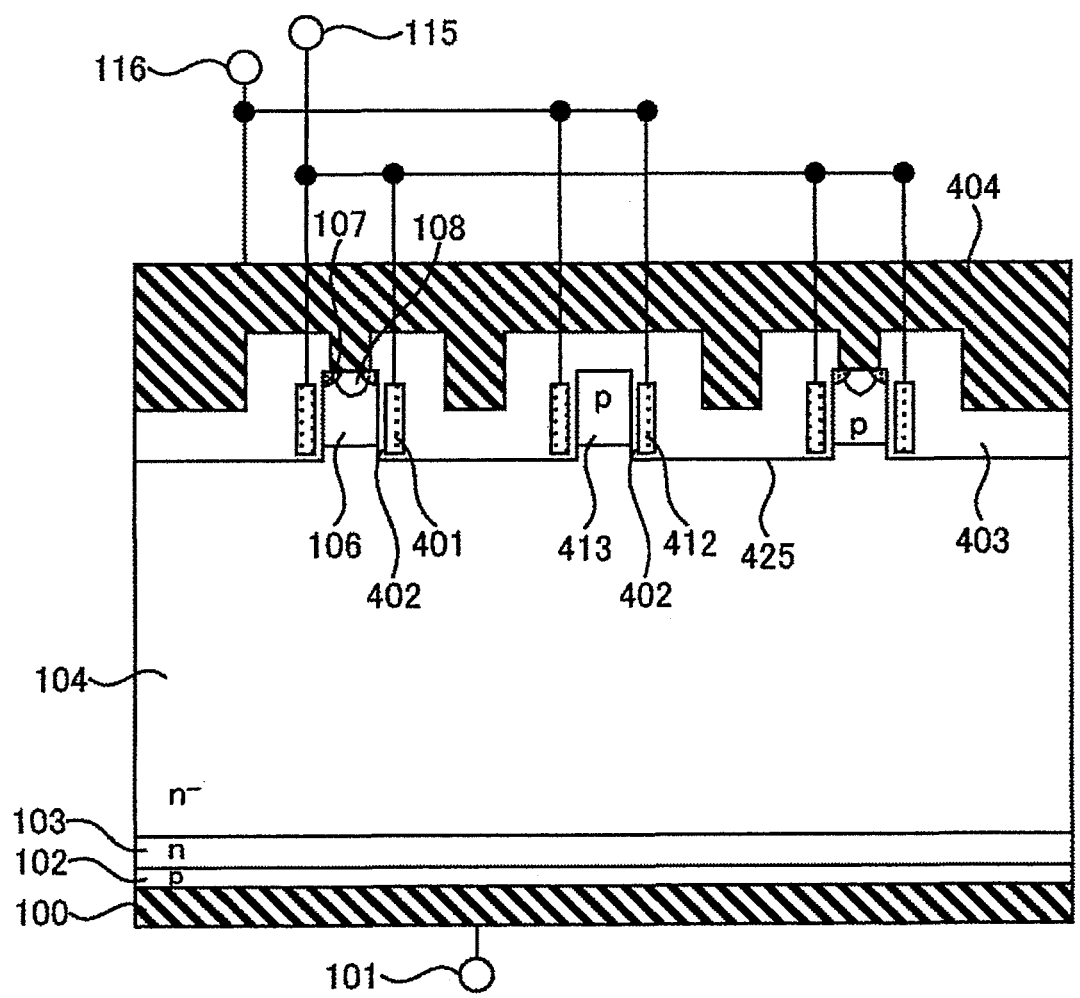
FIG. 16 is a cross-section diagram illustrating an IGBT according to an example of the seventh embodiment of the semiconductor of the invention.
Figure 17:
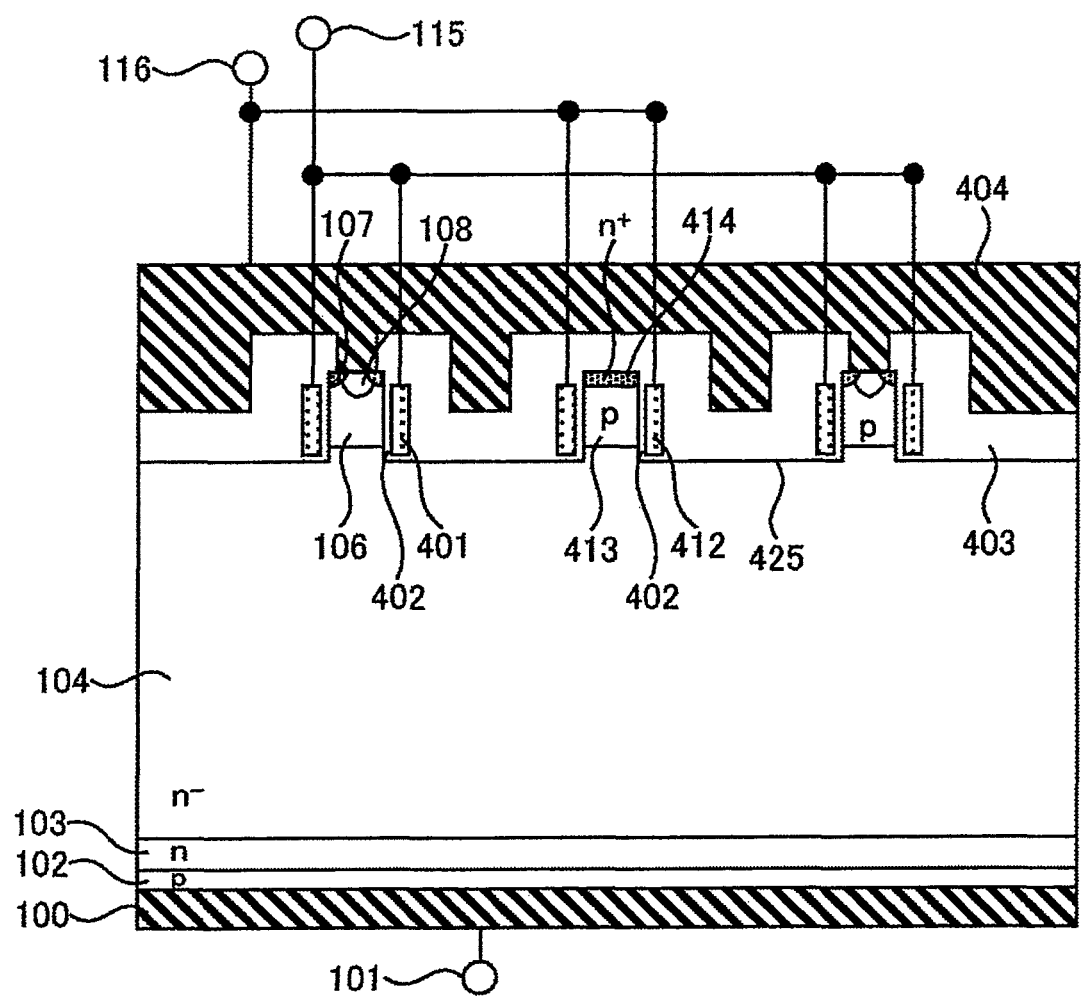
FIG. 17 is a cross-section diagram illustrating an IGBT according to an other example of the seventh embodiment of the semiconductor of the invention.
Figure 18:
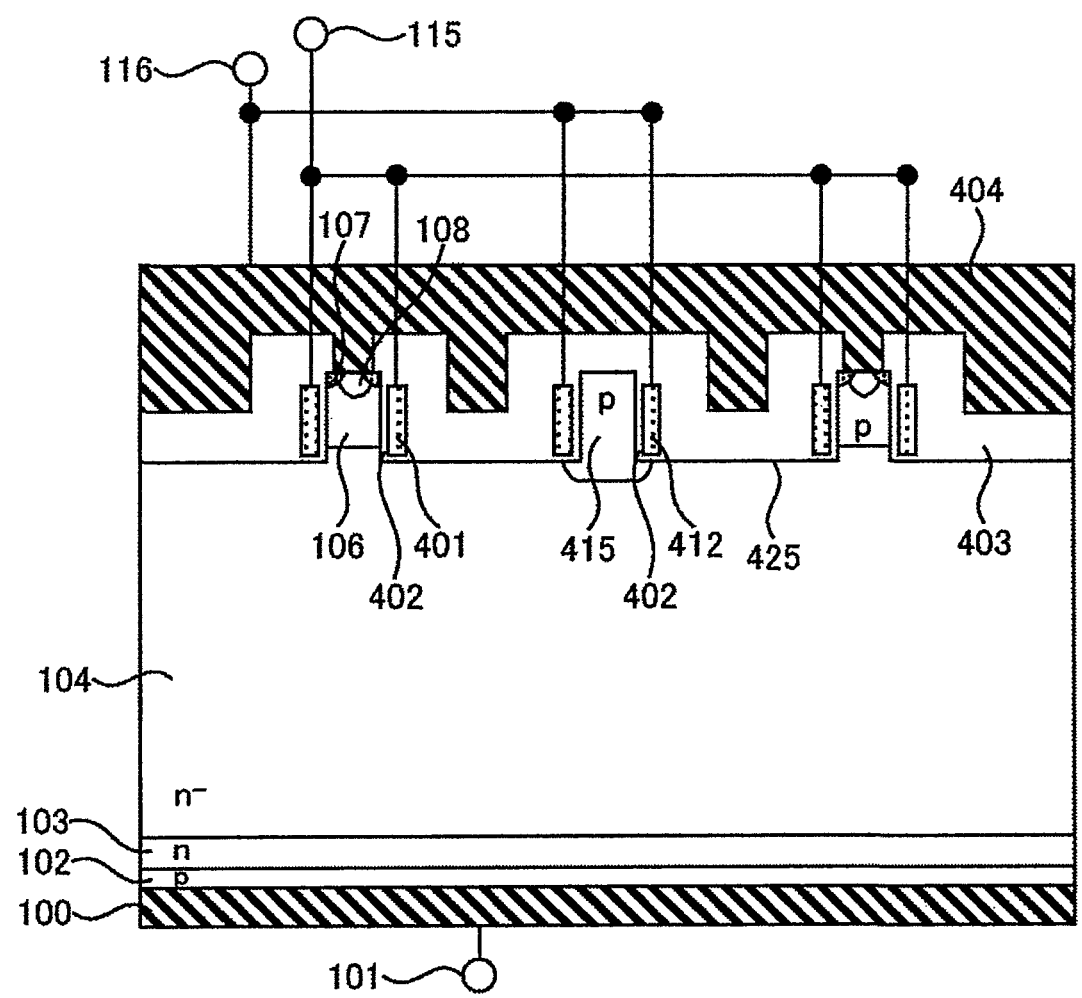
FIG. 18 is a cross-section diagram illustrating an IGBT according to an other example of the seventh embodiment of the semiconductor of the invention.
Figure 19:
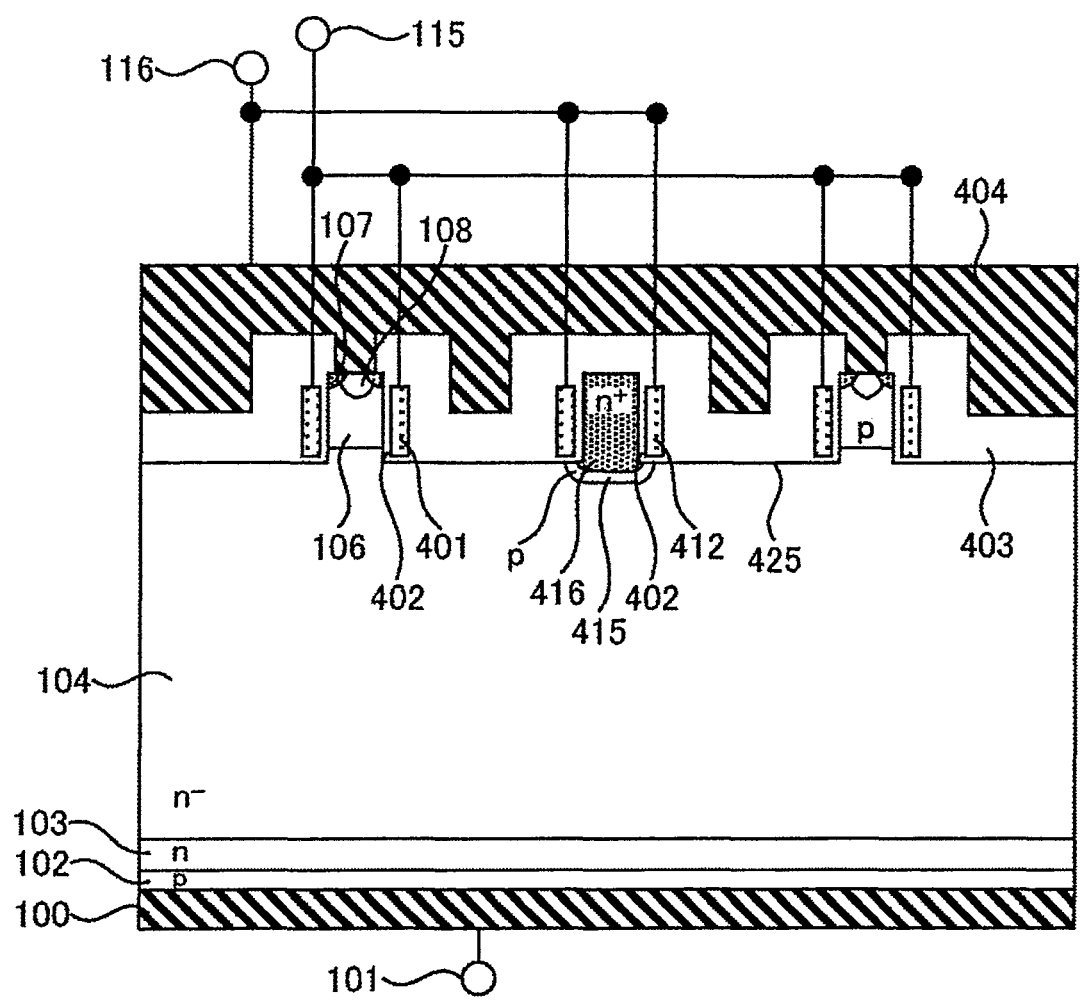
FIG. 19 is a cross-section diagram illustrating an IGBT according to an other example of the seventh embodiment of the semiconductor of the invention.

FIG. 15 to FIG. 19 illustrate a cross-sectional structure of an IGBT according to a seventh embodiment of the invention. In FIG. 15, a polysilicon electrode 412 is formed on the lateral face of a trench 425 likewise to the gate electrode 401, and the capacitor made up of the gate insulating layer 402 and the polysilicon electrode 412 is connected to the emitter electrode 404. In consequence, there is an advantage that the gate potential rise can be reduced during the turn-on operation. In FIG. 16, a p-layer 413 is formed between the polysilicon electrodes 412 to relax the electric field applied to the corner portion of the polysilicon electrode 412, therefore, the high breakdown voltage can be obtained. In FIG. 17, an n-layer 414 is formed on the p-layer 413 to prevent the holes from flowing into the floating p-layer 413 during the turn-on operation. In consequence, there is an advantage that the potential rise of the floating p-layer is inhibited. In FIG. 18, a p-layer 415 is formed so as to cover the corner portion of polysilicon electrode 412, so that a high breakdown voltage can be obtained. Further, in FIG. 19, an n-layer 416 is formed on the p-layer 415 to prevent the holes from flowing into the floating p-type 415 during the turn-on operation, and there is the advantage that the potential rise of the floating p-layer is inhibited.

Eighth Embodiment

Figure 20:
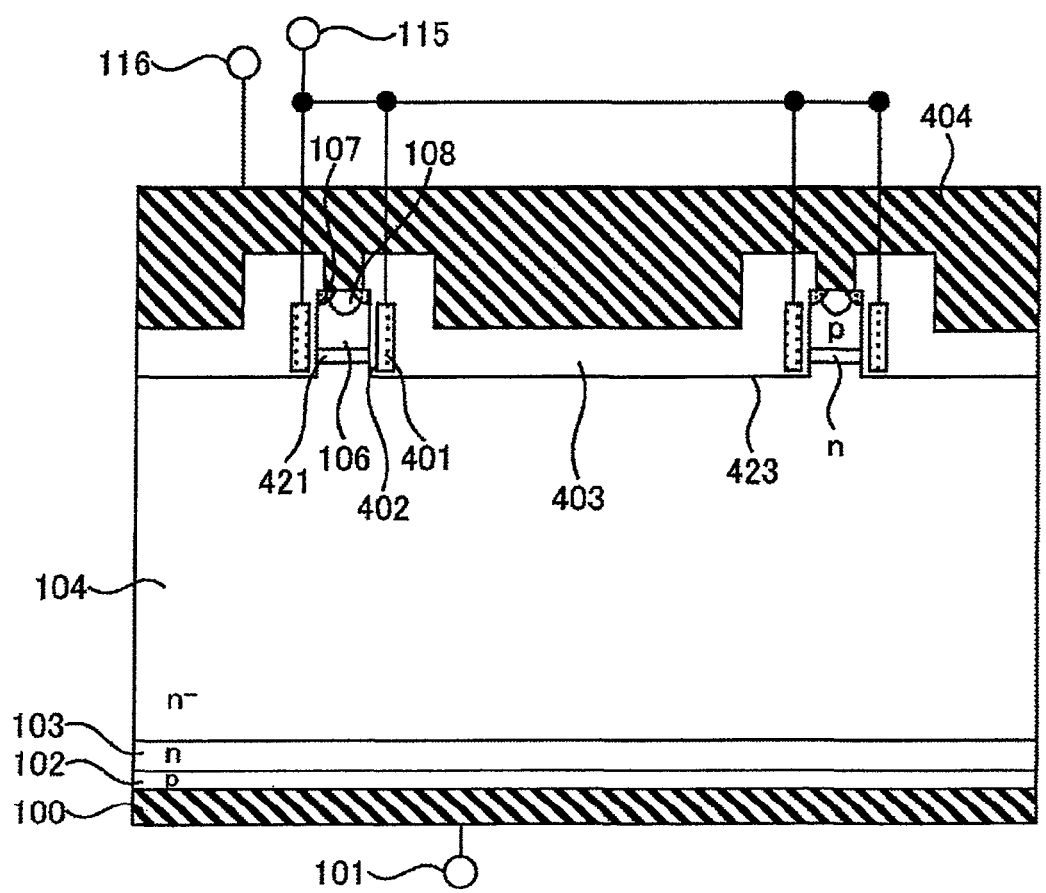
FIG. 20 is a cross-section diagram illustrating an IGBT according to an eighth embodiment of the semiconductor of the invention.

FIG. 20 illustrates a cross-sectional structure of an IGBT according to an eighth embodiment of the invention. A feature of the eighth embodiment is that an n-layer 421 is inserted underneath the p-channel layer 106. Since the n-layer 421 works as a barrier for the holes flowing into the emitter electrode 404, a hole concentration in the vicinity of the emitter increases. In consequence, the on-voltage can be further reduced.

Ninth Embodiment

Figure 21:
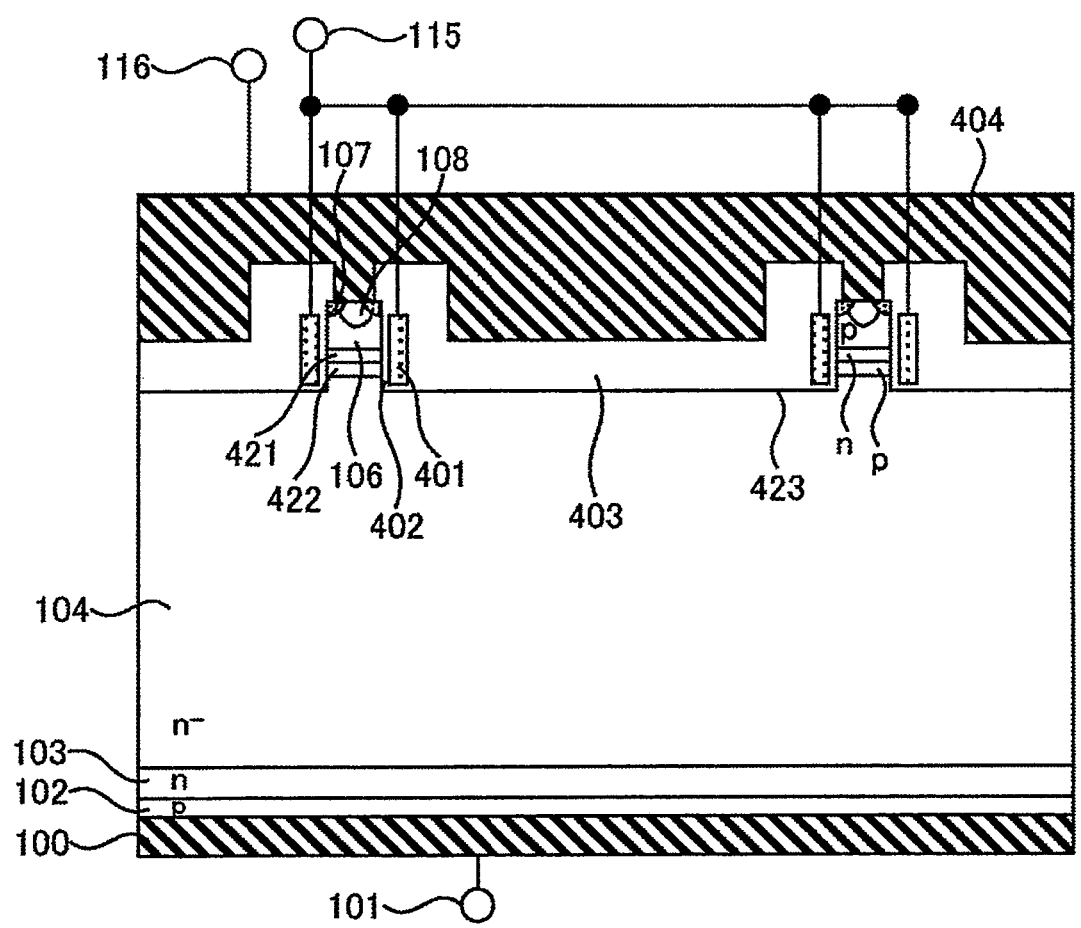
FIG. 21 is a cross-section diagram illustrating an IGBT according to a ninth embodiment of the semiconductor of the invention.

FIG. 21 illustrates a cross-sectional structure of an IGBT according to a ninth embodiment of the invention. A feature of the ninth embodiment is that a p-layer 422 is inserted underneath the n-layer 421. In the structure of the eighth embodiment, the higher the carrier concentration of the n-layer 421, the higher the barrier for the holes, so that the reduction effect of the on-voltage becomes high. However, the electric field intensity becomes strong at the n-layer 421 during off-state, and it is therefore expected that the breakdown voltage is reduced.

In this embodiment as mentioned above, the p-layer 422 is added to underneath the n-layer 421 to relax the electric field intensity at the n-layer 421. Therefore, the breakdown voltage can be maintained even if the carrier concentration is made high, so that the on-voltage can be further reduced.

Tenth Embodiment

Figure 22:
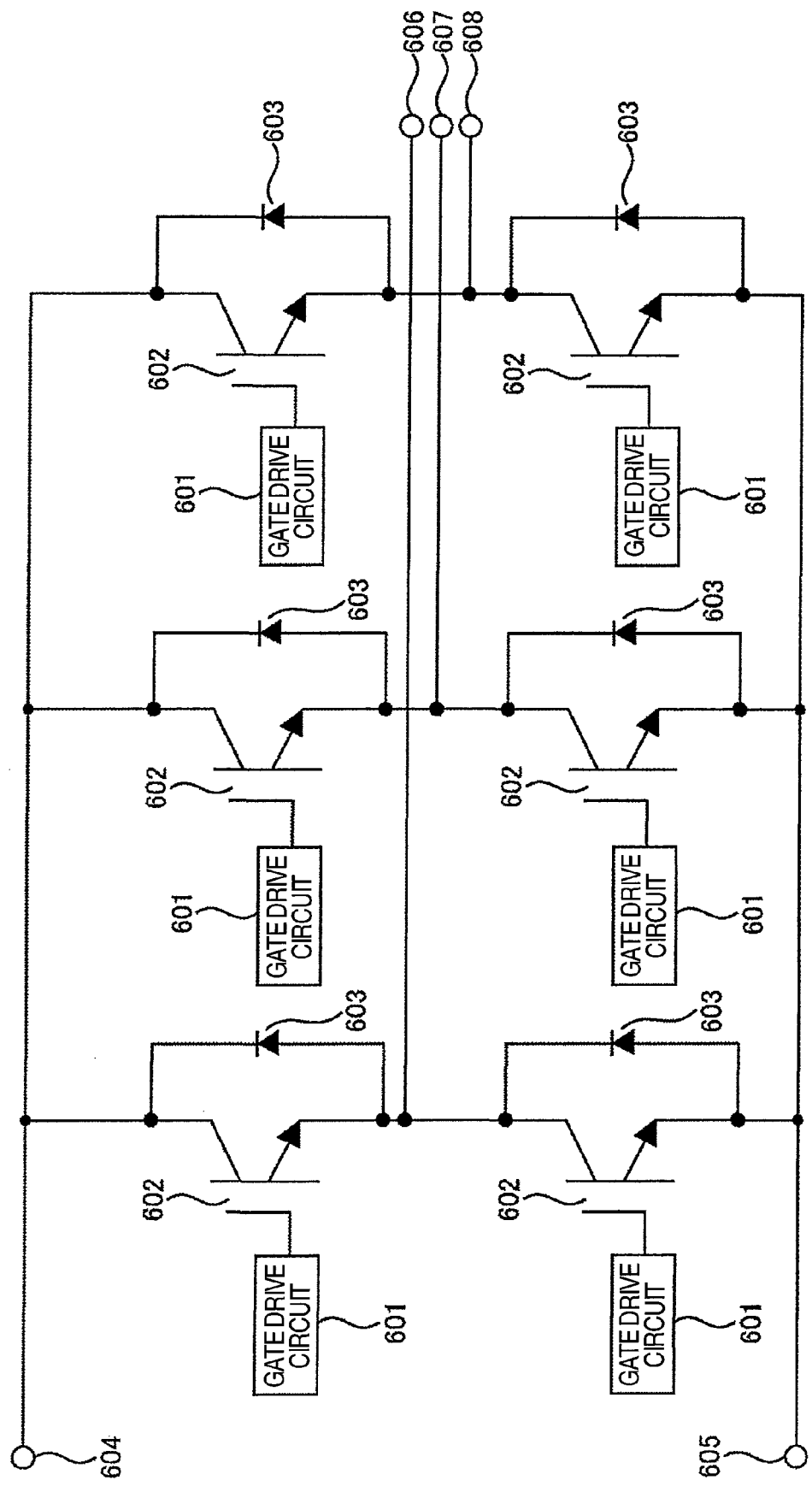
FIG. 22 is a circuit diagram representing one embodiment of a power conversion apparatus of the invention.

FIG. 22 is a circuit diagram representing a power conversion apparatus employing the IGBT described in the above-mentioned embodiments.

FIG. 22 represents an inverter circuit diagram in the embodiments. A reference numeral 601 denotes a gate drive circuit, 602 denotes an IGBT, 603 denotes a diode, 604, 605 denote an input terminal, and 606 to 608 denote an output terminal. A power conversion apparatus is configured in which the IGBT described in the first to ninth embodiments is applied to the inverter circuit.

The IGBT in the embodiments mentioned above is applied to the power conversion apparatus to thereby realize a low loss and high reliability of the power conversion apparatus.

The same advantages as in the inverters described above can also be obtained in a power conversion apparatus such as a converter, chopper, etc.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:
1. A semiconductor device comprising:
a first semiconductor layer of a first conductive type;
a second semiconductor layer of a second conductive type formed in the vicinity of a surface of the first semiconductor layer;
a third semiconductor layer of the second conductive type adjacent to the first semiconductor layer and formed in the vicinity of a surface of an opposite side of the second semiconductor layer;
a fourth semiconductor layer of the first conductive type selectively formed on the third semiconductor layer;
a trench penetrating through the fourth semiconductor layer and the third semiconductor layer into the first semiconductor layer;
a gate insulating layer formed along an internal face of the trench;
an insulating layer formed in the trench;
a first conductive layer formed on a surface of the gate insulating layer; and a second conductive layer formed on a surface of the insulating layer, wherein
the first conductive layer in the trench of at least one cross-sectional structure is divided by the insulating layer and the second conductive layer,
a width "a" of the trench is wider than a width "b" of an area in which the trench is not formed,
the first conductive layer is formed on a lateral face of the trench having the width "a",
the insulating layer is thicker than the gate insulating layer,
the insulating layer of an active area in the semiconductor device is thinner than the insulating layer of a peripheral area in the semiconductor device, and
a capacitor made up of the insulating layer and a third conductive layer is formed in the trench.
2. The semiconductor device according to claim 1, wherein the first conductive layer is covered by the gate insulating layer and the insulating layer.
3. A semiconductor device comprising:
a first semiconductor layer of a first conductive type;
a second semiconductor layer of a second conductive type formed in the vicinity of a surface of the first semiconductor layer;
a third semiconductor layer of the second conductive type adjacent to the first semiconductor layer and formed in the vicinity of a surface of an opposite side of the second semiconductor layer;
a fourth semiconductor layer of the first conductive type selectively formed on the third semiconductor layer;
a trench penetrating through the fourth semiconductor layer and the third semiconductor layer into the first semiconductor layer;
a gate insulating layer formed along an internal face of the trench;
an insulating layer formed in the trench;
a first conductive layer formed on a surface of the gate insulating layer; and
a second conductive layer formed on a surface of the insulating layer, wherein
the first conductive layer in the trench of at least one cross-sectional structure is divided by the insulating layer and the second conductive layer,
a width "a" of the trench is wider than a width "b" of an area in which the trench is not formed,
the first conductive layer and the gate insulating layer are formed on a lateral face of the trench,
the insulating layer of an active area in the semiconductor device is thinner than the insulating layer of a termination area in the semiconductor device, and a thickness of the insulating layer in the active area of the semiconductor device ranges from 300 nm to 1000 nm.

4. The semiconductor device according to claim 1, wherein the trench is formed of a two step staircase pattern.

5. A semiconductor device comprising:
a first semiconductor layer of a first conductive type;
a second semiconductor layer of a second conductive type formed in the vicinity of a surface of the first semiconductor layer;
a third semiconductor layer of the second conductive type adjacent to the first semiconductor layer and formed in the vicinity of a surface of an opposite side of the second semiconductor layer;
a fourth semiconductor layer of the first conductive type selectively formed on the third semiconductor layer;
a trench penetrating through the fourth semiconductor layer and the third semiconductor layer into the first semiconductor layer;
a gate insulating layer formed along an internal face of the trench;
an insulating layer formed in the trench;
a first conductive layer formed on a surface of the gate insulating layer; and
a second conductive layer formed on a surface of the insulating layer, wherein
the first conductive layer in the trench of at least one cross-sectional structure is divided by the insulating layer and the second conductive layer,
a width "a" of the trench is wider than a width "b" of an area in which the trench is not formed,
the first conductive layer and the gate insulating layer are formed on a lateral face of the trench,
the trench is formed of a two step staircase pattern, and
the second conductive layer in the trench formed of the two step staircase pattern protrudes deeper than the edge portion of the first conductive layer facing the first semiconductor layer.

6. The semiconductor device according to claim 1, wherein a fifth semiconductor layer of the second conductive type is formed on a first semiconductor layer side of the trench.

7. The semiconductor device according to claim 6, wherein the fifth semiconductor layer is formed so as to cover a first semiconductor layer side of the first conductive layer.

8. The semiconductor device according to claim 6, wherein a sixth semiconductor layer of the first conductive type is formed in the fifth semiconductor layer.

9. The semiconductor device according to claim 8, wherein a seventh semiconductor layer of the second conductive type is formed on a first semiconductor layer side of the third semiconductor layer.

10. The semiconductor device according to claim 9, wherein the seventh semiconductor layer covers at least one part of the first semiconductor layer side of the first conductive layer.

11. The semiconductor device according to claim 9, wherein the seventh semiconductor layer is divided into two layers, and the respective seventh semiconductor layers cover at least one part of the first semiconductor layer side of the first conductive layer.

12. The semiconductor device according to claim 1, wherein the third conductive layer is formed on a part of a lateral face of the trench, and a capacitor made up of the third conductive layer and the gate insulating layer is electrically connected to the second conductive layer.

13. The semiconductor device according to claim 9, wherein an eighth semiconductor layer of the second conductive type is formed between the third conductive layers.

14. The semiconductor device according to claim 13, wherein a ninth semiconductor layer of the first conductive type is formed on an opposite side of the first semiconductor layer side of the eighth semiconductor layer.

15. The semiconductor device according to claim 13, wherein the eighth semiconductor layer is formed so as to cover the first semiconductor layer side of the third conductive layer.

16. The semiconductor device according to claim 14, wherein the ninth semiconductor layer protrudes deeper than an edge portion of the trench facing the first semiconductor layer.

17. The semiconductor device according to claim 14, wherein a tenth semiconductor layer of the first conductive type is formed on a first semiconductor layer side of the third semiconductor layer.

18. The semiconductor device according to claim 17, wherein an eleventh semiconductor layer of the second conductive type is formed on a first semiconductor layer side of the tenth semiconductor layer.

19. The semiconductor device according to claim 1, wherein a thickness of the insulating layer in the active area of the semiconductor device ranges from 300 nm to 1000 nm.

20. The semiconductor device according to claim 1, wherein a side edge portion of the first semiconductor layer of the second conductive layer in the trench formed of the two step staircase patter is positioned on a first semiconductor layer side rather than the side edge portion of the first semiconductor layer of the first conductive layer.

21. The semiconductor device according to claim 20, wherein
a fifth semiconductor layer of the second conductive type is formed on a first semiconductor layer side of the trench, and
the fifth semiconductor layer is formed so as to cover a side edge portion of the first semiconductor layer of the first conductive layer.

\* \* \* \* \*